(12) United States Patent
Horio et al.

(10) Patent No.: US 8,148,735 B2
(45) Date of Patent: Apr. 3, 2012

(54) OPTICAL COMMUNICATION MODULE

(75) Inventors: Tomoharu Horio, Kyoto (JP); Yuki Tanuma, Kyoto (JP); Satoshi Nakamura, Kyoto (JP); Kazumi Morimoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 513 days.

(21) Appl. No.: 11/885,975

(22) PCT Filed: Mar. 6, 2006

(86) PCT No.: PCT/JP2006/304249
§ 371 (c)(1),
(2), (4) Date: Sep. 7, 2007

(87) PCT Pub. No.: WO2006/095676
PCT Pub. Date: Sep. 14, 2006

(65) Prior Publication Data
US 2009/0039377 A1    Feb. 12, 2009

(30) Foreign Application Priority Data

| Mar. 7, 2005 | (JP) | .............................. 2005-061781 |
| Mar. 16, 2005 | (JP) | .............................. 2005-074996 |
| Jul. 25, 2005 | (JP) | .............................. 2005-214115 |
| Jul. 26, 2005 | (JP) | .............................. 2005-215270 |

(51) Int. Cl.
*H01L 31/12* (2006.01)

(52) U.S. Cl. ............... 257/81; 257/80; 257/98; 257/99; 257/E33.058; 257/E33.076; 257/E25.032

(58) Field of Classification Search ............... 257/80, 257/81, E33.058, E33.076, E25.032, 680, 257/97
See application file for complete search history.

(56) References Cited

U.S. PATENT DOCUMENTS

| 6,590,152 B1 * | 7/2003 | Horio et al. ............... 174/354 |
| D551,251 S * | 9/2007 | Horio ............... D14/496 |
| D555,604 S * | 11/2007 | Horio et al. ............... D13/165 |
| D563,327 S * | 3/2008 | Horio et al. ............... D13/165 |
| 2002/0001192 A1* | 1/2002 | Suehiro et al. ............... 362/240 |
| 2002/0094177 A1* | 7/2002 | Horio ............... 385/94 |

(Continued)

FOREIGN PATENT DOCUMENTS

JP        6-45656         2/1994

(Continued)

OTHER PUBLICATIONS

English machine translation of JP11-345999.*

(Continued)

*Primary Examiner* — Matthew Reames
*Assistant Examiner* — Christopher M Roland
(74) *Attorney, Agent, or Firm* — Hamre, Schumann, Mueller & Larson, P.C.

(57) ABSTRACT

An infrared data communication module (A1) includes a substrate (1) consisting of a first layer (1A) and a second layer (1B), where the first layer is formed with a recess (11) open at its obverse surface, and includes the opening of the recess (11) and the second layer is fixed to the first layer (1A) on the side opposite from the opening. The module also includes a bonding conductor layer (6A) covering at least the bottom surface of the recess (11), a light emitting element (2) mounted on the bonding conductor layer (6A), and a heat dissipating conductor layer (6C) sandwiched between the first layer (1A) and the second layer (1B) and connected to the bonding conductor layer (6A).

23 Claims, 13 Drawing Sheets

U.S. PATENT DOCUMENTS

| | | | |
|---|---|---|---|
| 2002/0154667 A1* | 10/2002 | Shimonaka | 372/50 |
| 2003/0156842 A1 | 8/2003 | Morimoto et al. | |
| 2004/0135156 A1 | 7/2004 | Takenaka | |
| 2005/0072981 A1* | 4/2005 | Suenaga | 257/88 |
| 2007/0138493 A1* | 6/2007 | Morimoto et al. | 257/95 |
| 2007/0194339 A1* | 8/2007 | Horio | 257/99 |
| 2008/0054288 A1* | 3/2008 | Harrah et al. | 257/99 |

FOREIGN PATENT DOCUMENTS

| | | |
|---|---|---|
| JP | 7-202271 | 8/1995 |
| JP | 10154825 A * | 6/1998 |
| JP | 10321900 A * | 12/1998 |
| JP | 11-8415 | 1/1999 |
| JP | 11-345999 | 12/1999 |
| JP | 2000-340846 | 12/2000 |
| JP | 2001-345485 | 12/2001 |
| JP | 2003-244077 | 8/2003 |
| JP | 2004-214436 | 7/2004 |
| JP | 2004-226433 | 8/2004 |
| JP | 2005-19488 | 1/2005 |
| JP | 2005-39039 | 2/2005 |

OTHER PUBLICATIONS

English machine translation of JP2005-039039.*
English machine translation of JP06-045656.*
English machine translation of JP2000-340846.*
English machine translation of JP10-154825.*
International Search Report from the corresponding PCT/JP2006/304249, mailed May 30, 2006.

* cited by examiner

OPTICAL COMMUNICATION MODULE

TECHNICAL FIELD

The present invention relates to an optical communication module used for data communication utilizing e.g. infrared rays, and a method for manufacturing such an optical communication module.

BACKGROUND ART

An infrared data communication module conforming to the IrDA is an example of optical communication module provided with a light emitting element and a light receiving element for interactive communication (See Patent Document 1, for example). Such infrared data communication modules have been widely used for a notebook computer, a cell phone and an electronic personal organizer, for example.

FIG. 28 shows an example of conventional infrared data communication module of this kind. The infrared data communication module X shown in the figure includes a light emitting element 92, a light receiving element 93 and a drive IC 94 which are mounted on a substrate 91, and a resin package 95. The resin package 95 includes two lens portions 95a and 95b positioned to face the light emitting element 92 and the light receiving element 93, respectively. The light emitting element 92 emits infrared rays. The directivity of the infrared rays emitted from the light emitting element 92 is enhanced by the lens portion 95a, and then the infrared rays exit upward in the figure. The infrared rays traveling from above is converged by the lens portion 95b onto the light receiving element 93. In this way, the infrared data communication module X performs interactive communication utilizing infrared rays.

However, the infrared data communication module X has the following drawbacks.

Recently, there is an increasing demand for the use of an infrared data communication module X for remote control of electrical appliances such as a television, in addition to the use for data communication conforming to the IrDA. In using the infrared data communication module for remote control, the distance between the infrared data communication module and the electrical appliance which is the object to be irradiated with infrared is considerably long, as compared with that in using the infrared data communication module for data communication. To cope with this condition, the amount of infrared rays emitted from the light emitting element 92 needs to be increased. One of the measures to increase the amount of infrared rays emitted from the light emitting element 92 is to increase the power supply to increase the output. Specifically, in using the infrared data communication module for data communication, current of several tens of mA is supplied to the light emitting element 92. On the other hand, to use the infrared data communication module for remote control, current of about 200 mA needs to be supplied. When such a large amount of current is supplied, a large amount of heat is produced from the light emitting element 92. Generally, however, the substrate 91 and the resin package 95 have a low thermal conductivity. Therefore, it is difficult to properly dissipate the heat produced from the light emitting element 92 to the outside of the infrared data communication module X. Therefore, the infrared data communication module X may be unduly heated to a high temperature. For this reason, it is difficult to sufficiently increase the output of the infrared data communication module X to realize the use of the module for remote control.

The size of electronic devices such as a notebook computer, a cell phone and an electronic personal organizer is being reduced year by year. Further, to improve the function of such an electronic device, the density at which electronic components are mounted to the electronic device is being increased considerably. Accordingly, there is a strong demand for the size reduction of the infrared data communication module X. To reduce the size of the infrared data communication module X, a relatively small light emitting element 92 needs to be used. To reliably perform data communication while reducing the size of the infrared data communication module X, it is necessary to increase the amount of infrared rays to be emitted from the light emitting element 92.

To form the resin package 95 by transfer molding, a mold is pressed against an aggregate board, and resin material is injected into the cavity of the mold. Then, the resin-molded body to become the resin package 95 is removed from the mold. The removal process is performed by pushing out the resin-molded body by an ejector pin provided at the mold. Generally, since a relatively large space exists between the lens portions 95a and 95b, the ejector pin is pressed to a region between the lens portions 95a and 95b. However, by this pressing, an excessively large force may be applied to the drive IC 94. In such a case, the drive IC 94 or a wire (not shown) provided for electrical connection of the drive IC 94 may be broken.

Further, the root of the lens portion 95a, 95b stands generally perpendicularly to the surface around the lens portion and is likely to be held strongly by the mold. Therefore, in removing the resin-molded body from the mold, only the lens portions 95a, 95b are sometimes kept held by the mold. When the ejector pin is pressed against the resin-molded body in this state, an excessively large stress is applied to the root of the lens portions 95a, 95b. This stress may form a crack at the root of the lens portions 95a, 95b.

To mount the infrared data communication module X to a circuit board of a notebook computer, a cell phone or an electronic personal organizer, for example, the technique of reflow soldering is employed. In reflow soldering, solder paste is melted in the reflow furnace. The solder paste changed into liquid has surface tension. Due to the surface tension, the infrared data communication module X may unduly move.

Patent Document 1: JP-A-2003-244077

DISCLOSURE OF THE INVENTION

Problems to be Solved by the Invention

An object of the present invention, which is proposed under the circumstances described above, is to provide an optical communication module capable of increasing the luminance and output, and to provide a method for properly manufacturing such an optical communication module.

Means for Solving the problems

To solve the above-described problems, the present invention takes the following measures.

According to a first aspect of the present invention, there is provided an optical communication module comprising: a substrate including a first layer and a second layer, the first layer being formed with a recess which opens at an obverse surface thereof and including the opening of the recess, the second layer being laminated to the first layer on a side opposite from the opening; a bonding conductor layer covering at least a bottom surface of the recess; a light emitting element mounted on the bonding conductor layer; and a heat dissipating conductor layer sandwiched between the first layer and the second layer and connected to the bonding conductor layer.

Preferably, the heat dissipating conductor layer is made of Cu or Cu alloy.

Preferably, the recess penetrates through the first layer.

Preferably, the recess further penetrates through the heat dissipating conductor layer.

Preferably, the heat dissipating conductor layer is larger than the recess when viewed in the thickness direction of the substrate.

Preferably, the optical communication module further comprises a through-hole extending from a surface of the second layer on which the heat dissipating conductor layer is formed to a surface of the substrate which is opposite from the opening of the recess, and the through-hole includes an inner surface formed with a through-hole conductor layer connected to the heat dissipating conductor layer. An additional heat dissipating conductor layer connected to the through-hole conductor layer is provided on the surface of the substrate which is opposite from the opening of the recess.

Preferably, the additional heat dissipating conductor layer is made of Cu or Cu alloy.

Preferably, the recess includes a first side surface having a diameter which increases as progressing from the bottom surface of the recess toward the opening.

Preferably, the recess includes a second side surface which is positioned closer to the bottom surface than the first side surface is and inclined with respect to an optical axis of the light emitting element at an angle of inclination which is smaller than the angle of inclination of the first side surface.

Preferably, the first side surface is connected to an obverse surface of the substrate, and the angle of inclination thereof with respect to the optical axis of the light emitting element is constant. The second side surface is connected to the bottom surface and tubular along the optical axis of the light emitting element.

Preferably, the first side surface and the second side surface are directly connected to each other.

Preferably, the angle of inclination of the first side surface with respect to the optical axis of the light emitting element is 30 to 40°.

Preferably, at least the first side surface is covered by the bonding conductor layer.

Preferably, the light emitting element is capable of emitting infrared rays, and the optical communication module further comprises a light receiving element for receiving infrared rays and a drive IC for driving and controlling the light emitting element and the light receiving element to function as an infrared data communication module.

Preferably, the heat dissipating conductor layer overlaps each of the light emitting element, the light receiving element and the drive IC when viewed in the thickness direction of the substrate.

Preferably, the optical communication module further comprises a resin package covering the light emitting element and the light receiving element, and the resin package includes at least one dome-shaped lens portion facing at least one of the light emitting element and the light receiving element. The resin package is formed with an inclined portion connected to at least part of the periphery of the at least one lens portion and forming an obtuse angle with part of the lens portion which is connected to the periphery.

Preferably, the angle of inclination of the inclined portion with respect to the surface of the resin package at which the lens portion is formed is 40 to 50°.

Preferably, when a point of intersection where a plane including the surface of the resin package at which the lens portion is formed meets the optical axis of the lens portion and an arbitrary point on the boundary between the lens portion and the inclined portion are connected to each other by a straight line, an angle of not larger than 20° is formed between the straight line and the plane including the surface at which the lens portion is formed.

Preferably, the substrate is in the form of an elongated rectangle, and the light emitting element and the light receiving element are mounted on the substrate side by side in the longitudinal direction of the substrate. The optical communication module further comprises a resin package covering the light emitting element and the light receiving element and including two lens portions facing the light emitting element and the light receiving element, respectively, and a shield cover for shielding the light emitting element and the light receiving element from electromagnetic wave and light. The shield cover is formed with at least two ground terminals for ground connection, and the ground terminals extend out from part of the shield cover and are spaced from each other in the longitudinal direction of the substrate.

Preferably, the shield cover includes a top plate extending between the two lens portions, a rear plate connected to the top plate and facing a side surface of the resin package extending in the longitudinal direction, and two side plates connected to the rear plate and respectively covering longitudinally opposite end surfaces of the resin package. The two ground terminals extend out from the two side plates in the longitudinal direction of the substrate.

Preferably, the substrate includes an end surface positioned on the opposite side of the rear plate, and the end surface is provided with a main terminal for supplying power and inputting/outputting a control signal with respect to the light emitting element and the light receiving element. The two ground terminals are located at positions offset toward the rear plate.

According to a second aspect of the present invention, there is provided a method for manufacturing an optical communication module. The method comprises the steps of: preparing a substrate by laminating a first layer, a second layer, and a heat dissipating conductor layer to intervene between the first layer and the second layer; forming a recess extending from an obverse surface of the first layer and reaching at least the heat dissipating conductor layer; forming a bonding conductor layer covering at least a bottom surface of the recess and connected to the heat dissipating conductor layer; and bonding a light emitting element on the bonding conductor layer.

Preferably, the recess formation step comprises forming the recess so as to penetrate through the heat dissipating conductor layer.

Preferably, the method further comprises the step of, before the step of laminating the first layer, the second layer and the heat dissipating conductor layer, forming a conductor layer to cover an obverse surface of the second layer and patterning the conductor layer to form the heat dissipating conductor layer on the second layer.

According to a third aspect of the present invention, there is provided a method for manufacturing an optical communication module. The method comprises the steps of: mounting a pair of element groups, each of which includes a light emitting element and a light receiving element arranged side by side in a first direction, on a substrate so that the element groups are spaced from each other in a second direction which is perpendicular to the first direction; forming a resin-molded body for covering the pair of element groups, the resin-molded body including four lens portions respectively facing the light emitting elements and the light receiving elements included in the paired element groups; and dividing the resin-molded body to separate the paired element groups from each other. The resin-molded body formation step is performed using a mold. The mold is provided with two ejector pins each positioned between two of the four lens portions, the two lens portions being spaced from each other in the second direction. The resin-molded body formation step comprises advancing the two ejector pins toward the resin-molded body to remove the resin-molded body from the mold.

Preferably, each of the element groups further includes an integrated circuit element for driving and controlling the light emitting element and the light receiving element, and the step of mounting the paired element groups on the substrate comprises mounting the integrated circuit element between the light emitting element and the light receiving element.

Other features and advantages of the present invention will become more apparent from detailed description given below with reference to the accompanying drawings.

BEST MODE FOR CARRYING OUT THE INVENTION

Preferred embodiments of the present invention will be described below with reference to the accompanying drawings.

Figure 1:
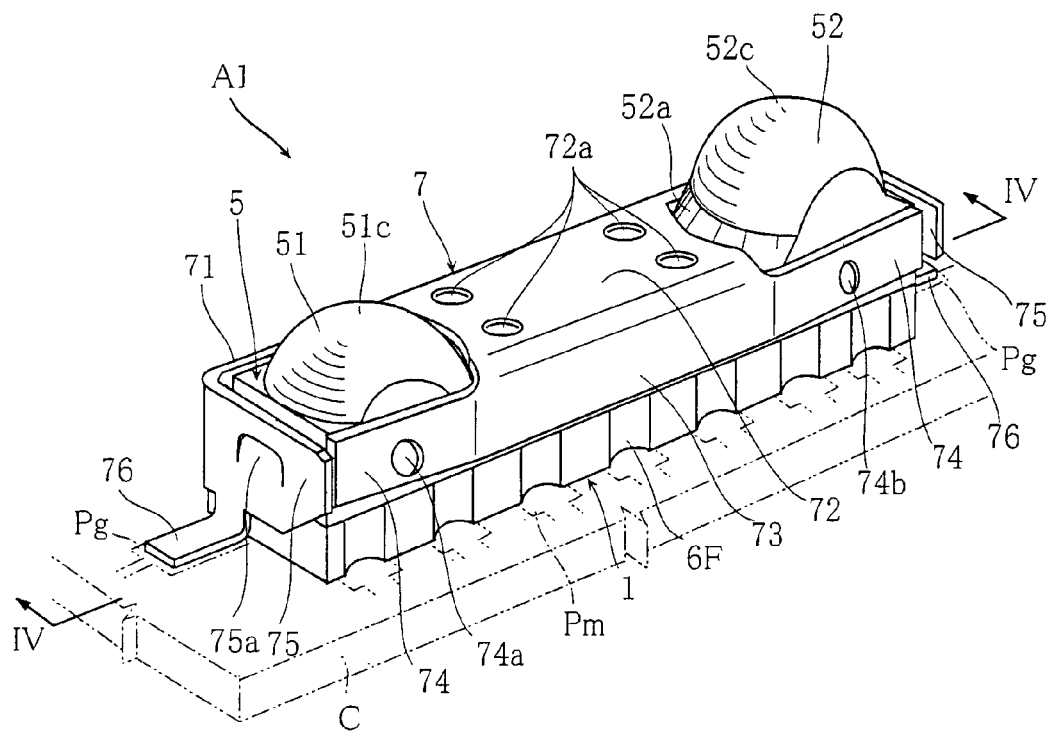
FIG. 1 is an overall perspective view showing an infrared data communication module according to a first embodiment of the present invention.
Figure 2:
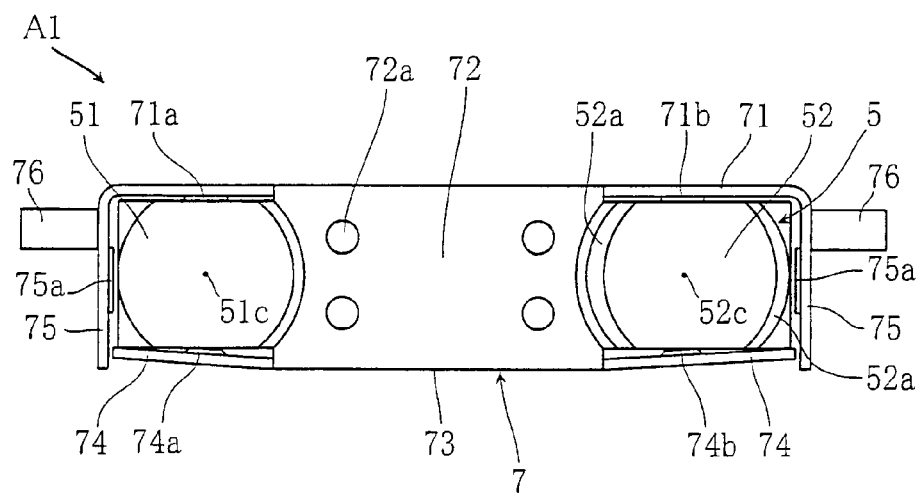
FIG. 2 is a plan view showing the infrared data communication module according to the first embodiment of the present invention.
Figure 3:
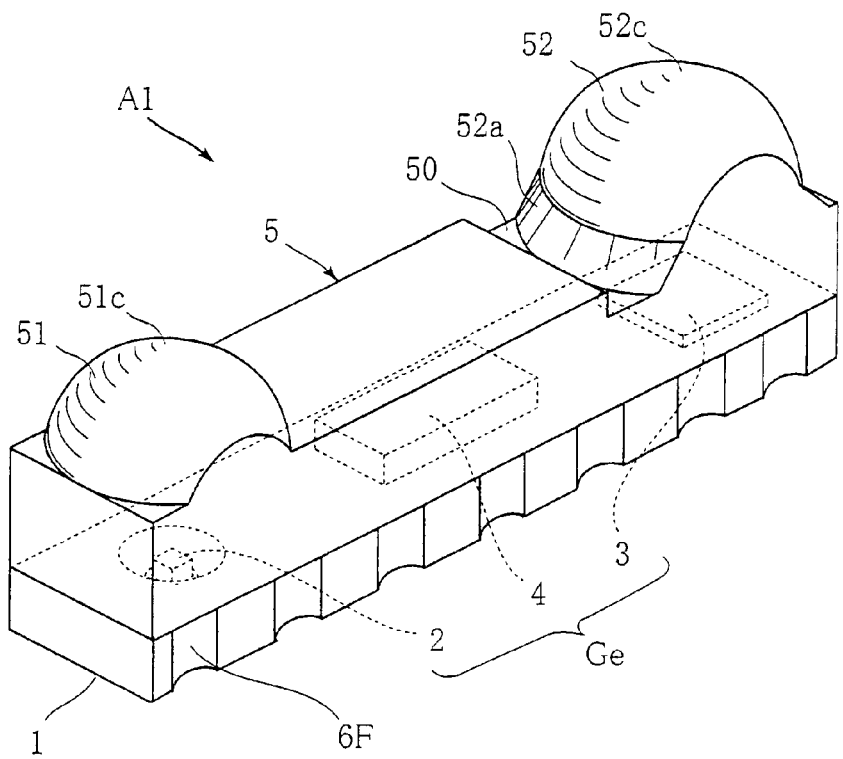
FIG. 3 is a perspective view showing a principal portion of the infrared data communication module according to the first embodiment of the present invention.
Figure 4:
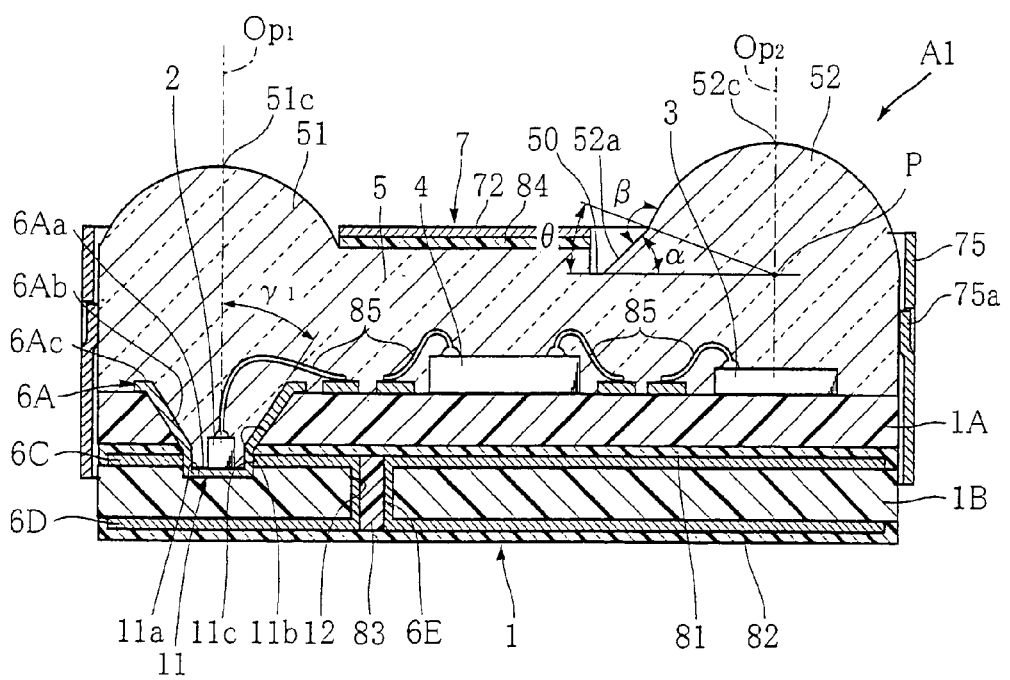
FIG. 4 is a sectional view taken along lines IV-IV in FIG. 1.
Figure 5:
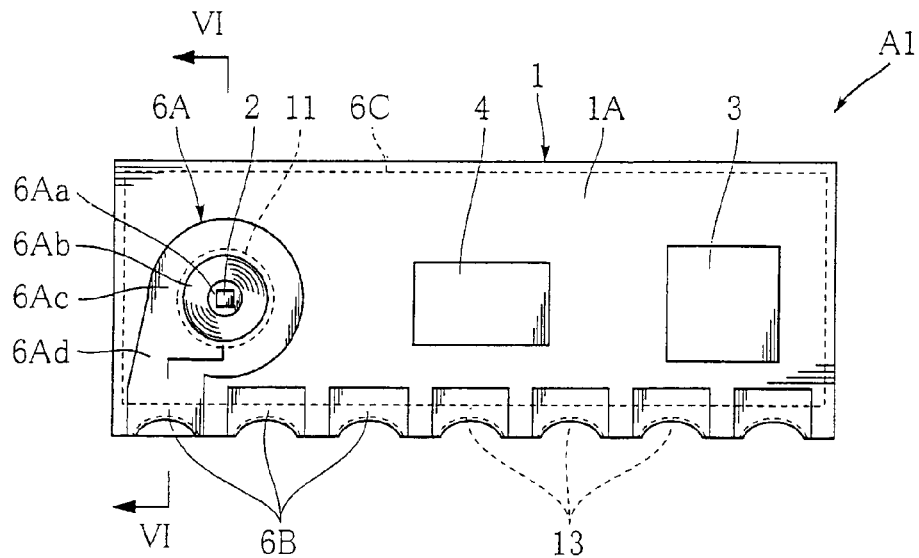
FIG. 5 is a plan view showing a principal portion of the infrared data communication module according to the first embodiment of the present invention.
Figure 6:
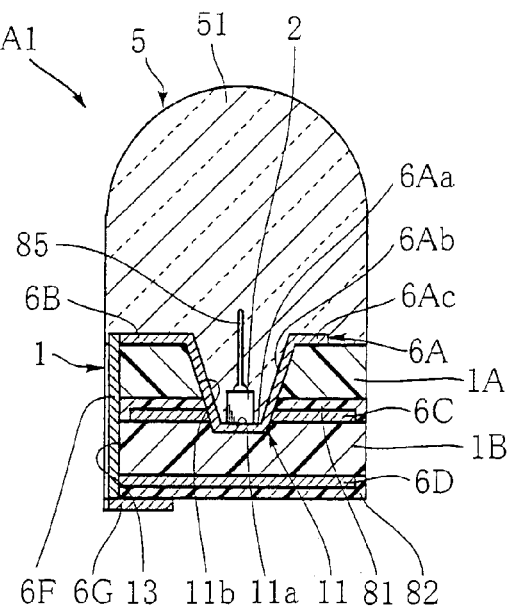
FIG. 6 is a sectional view taken along lines VI-VI in FIG. 5.

FIGS. 1-6 show an infrared data communication module according to a first embodiment of the present invention. The infrared data communication module A1 of this embodiment includes a substrate 1, a light emitting element 2, a light receiving element 3, a drive IC 4, a resin package 5 and a shield cover 7. The light emitting element 2, the light receiving element 3 and the drive IC 4 form an element group Ge. In FIGS. 3, 5 and 6, the illustration of the shield cover 7 is omitted for convenience. In FIG. 5, the illustration of the resin package 5 is omitted for convenience.

As shown in FIG. 5, the substrate 1 is in the form of an elongated rectangle in a plan view. As shown in FIG. 4, the substrate is a so-called laminated board including a first layer 1A and a second layer 1B. Both of the first layer 1A and the second layer 1B are made of resin such as glass-fiber-reinforced epoxy resin. The first layer 1A and the second layer 1B are bonded together with an adhesive 81.

The upper surface of the second layer 1B is formed with a heat dissipating conductor layer 6C. The heat dissipating conductor layer 6C may be made of Cu or Cu alloy and is generally in the form of an elongated rectangle slightly smaller than the outer shape of the substrate 1 in a plan view, as shown in FIG. 5. In this embodiment, the periphery of the heat dissipating conductor layer 6C is positioned about 0.15 mm inward from each side surface of the substrate 1. The heat dissipating conductor layer 6C may have a thickness of about 18 μm. To properly exhibit the advantages of the present invention which will be described later, it is preferable that the heat dissipating conductor layer has a thickness of about 10 to 30 μm.

The second layer 1B is formed with a through-hole 12 penetrating the second layer in the thickness direction. The through-hole 12 includes an inner surface formed with a through-hole conductor layer 6E and is loaded with through-hole resin 83. The lower surface of the second layer 1B is formed with a heat dissipating conductor layer 6D. The heat dissipating conductor layer 6D may be made of Cu or Cu alloy and is an example of additional heat dissipating conductor layer of the present invention. The heat dissipating conductor layers 6C and 6D are connected to each other via the through-hole conductor layer 6E.

As shown in FIG. 4, a recess 11 is formed at an upper portion of the substrate 1. The recess 11 is provided for arranging the light emitting element 2 at a position close to the center of the substrate 1 in the thickness direction. The recess 11 opens upward in the figure. In this embodiment, the recess 11 penetrates the first layer 1A and the heat dissipating conductor layer 6C, and the end of the recess reaches the second layer 1B.

The recess 11 includes a bottom surface 11a, a first side surface 11b and a second side surface 11c. On the bottom surface 11a, the light emitting element 2 is mounted via a bonding conductor layer 6A. The first side surface 11b is connected to the upper surface of the substrate 1 and comprises a tapered surface which is circular in section and inclined with respect to the optical axis $Op_1$ of the light emitting element 2. In this embodiment, the angle of inclination $\gamma_1$ of the first side surface 11b with respect to the optical axis $Op_1$ is 35°. To properly exhibit the function to reflect infrared rays, which will be described later, it is preferable that the angle of inclination $\gamma_1$ is about 30 to 40°. The second side surface 11c is connected to the bottom surface 11a and the first side surface 11b and cylindrical. The recess 11 may be formed by machining, i.e., forming the first side surface 11b from the upper side of the substrate 1 using a cone drill and then forming the second side surface 11c using a cylindrical drill. In this embodiment, the recess 11 has a depth of about 0.18 to 0.23 mm. The first side surface 11b has a depth of about 0.08 to 0.17 mm, a diameter of about 0.8 to 1.2 mm at the upper end thereof and a diameter of about 0.6 to 0.7 mm at the lower end thereof in FIG. 4. The second side surface 11c has a depth of about 0.1 mm and a diameter of about 0.6 to 0.7 mm. It is preferable that the height of the second side surface 11c is about 0.06 to 0.1 mm to correspond to the height of the light emitting element 2.

The recess 11 is covered with the bonding conductor layer 6A. The bonding conductor layer 6A is utilized for bonding the light emitting element 2 and has a laminated structure comprising a Cu layer, an Ni layer and an Au layer, for example. The thicknesses of the Cu layer, the Ni layer and the Au layer may be about 5 μm, 5 μm and 0.5 μm, respectively. The light emitting element 2 is bonded to the bottom 6Aa of the bonding conductor layer 6A. The bonding conductor layer 6A includes a side surface portion 6Ab covering the first side surface 11b and the second side surface 11c of the recess 11. The side surface portion surrounds the light emitting element 2 and serves to reflect the infrared rays traveling sideways from the light emitting element 2 upward in the figure. The side surface portion 6Ab of the bonding conductor layer 6A and the heat dissipating conductor layers 6C are connected to each other. Therefore, the bonding conductor layer 6A, the heat dissipating conductor layers 6C, 6D and the through-hole conductor layer 6E are not only connected electrically to each other but also properly conduct heat to each other.

As shown in FIG. 5, the bonding conductor layer 6A includes a collar portion 6Ac which is in the form of a doughnut surrounding the recess 11 in plan view. An extension 6Ad extends from the collar portion 6Ac. The end surface of the substrate 1 which is on the lower side in the figure is formed with a plurality of arcuate grooves 13. The portions where the grooves 13 and the obverse surface of the first layer 1A meet are respectively formed with terminal conductor layers 6B. The leftmost one of the terminal conductor layers 6B is connected to the extension 6Ad.

As shown in FIG. 6, the groove 13 has an inner surface formed with a groove conductor layer 6F made of Cu or Cu alloy. The groove conductor layer 6F is connected to the heat dissipating conductor layer 6D. Therefore, the bonding conductor layer 6A and the heat dissipating conductor layer 6D are electrically connected to each other and properly conduct heat to each other also via the groove conductor layer 6F. The lower surface of the heat dissipating conductor layer 6D is covered with an insulating layer 82. The insulating layer 82 may be made of epoxy resin. The lower surface of the insulating layer 82 is formed with a plurality of main terminals 6G provided correspondingly to the grooves 13 shown in FIG. 5. Of these main terminals 6G, the one shown in FIG. 6 is electrically connected to the heat dissipating conductor layer 6D and the bonding conductor layer 6A via the groove conductor layer 6F. The main terminal 6G is utilized for ground connection of the light emitting element 2, the light receiving element 3 and the drive IC 4.

The light emitting element 2 may comprise an infrared emitting diode capable of emitting infrared rays. As shown in FIG. 4, the light emitting element is connected to the illustrated wiring pattern via a wire 85. The light receiving element 3 may comprise a PIN photodiode capable of detecting infrared rays and is connected to the illustrated wiring pattern via a wire 85. The drive IC 4 drives and controls the infrared emission/reception of the light emitting element 2 and the light receiving element 3. The drive IC is connected to the illustrated wiring pattern via wires 85 and also connected to the light emitting element 2 and the light receiving element 3 via the wiring pattern. In this embodiment, the light emitting element 2 has a size of about 0.35 mm square in plan view and a height of about 0.16 mm. Therefore, the portion of the light emitting element 2 which corresponds to two thirds of the height is surrounded by the side surface 11c of the recess 11.

The resin package 5 may be made of epoxy resin containing a pigment and is not pervious to light rays other than infrared rays but pervious to infrared rays. The resin package 5 is formed by e.g. transfer molding and provided on the substrate 1 so as to cover the light emitting element 2, the light receiving element 3 and the drive IC 4, as shown in FIG. 4. As shown in FIGS. 3 and 4, the resin package 5 is integrally formed with two lens portions 51 and 52. The lens portions 51 and 52 bulge upward in the figure. The lens portion 51 is positioned to face the light emitting element 2 and causes the infrared rays traveling from the light emitting element 2 to converge before emission to the outside. The lens portion 52 is positioned to face the light receiving element 3 and causes the infrared rays transmitted to the infrared data communication module A1 to converge and impinge on the light receiving element 3.

The resin package 5 includes an inclined portion 52a. The inclined portion 52a connects the periphery of the lens portion 52a to the surface 50 at which the lens portion 52 is provided. As shown in FIG. 4, the angle β formed by the inclined portion 52a and the lower portion of the lens portion 52 is an obtuse angle. The angle of inclination α of the inclined portion 52a with respect to the plane including the surface 50 is 45°. It is preferable that the angle of inclination α is 40 to 45°.

In this embodiment, the setting of the size of the inclined portion 52a is based on the size of the lens portion 52, as follows. The point P in the figure is the intersection of the plane including the surface 50 with the optical axis $Op_2$ of the lens portion 52. When a straight line is drawn which connects the intersection P to the upper edge of the inclined portion 52a, i.e., an arbitrary point on the boundary between the inclined portion 52a and the lens portion 52, an angle θ is formed between the straight line and the plane including the surface 50. In this embodiment, the size of the inclined portion 52a is taken to be a value that makes the angle θ equal to 20° or less.

The shield cover 7 serves to shield the drive IC 4 from electromagnetic wave and light and is provided to cover the substrate 1 and the resin package 5. The shield cover 7 may be formed by bending a metal plate and includes a rear plate 71, a top plate 72, a press plate 73 and two side plates 75, as shown in FIGS. 1 and 2.

The rear plate 71 covers the side surfaces of the substrate 1 and resin package 5 on the opposite side of the groove conductor layer 6F. The top plate 72 covers the portion of the resin package 5 between the two lens portions 51 and 52 and is connected to the rear plate 71 generally perpendicularly. The press plate 73 covers the side surface of the resin package 5 on the side provided with the groove conductor layer 6F and is connected to the top plate 72 generally perpendicularly. The press plate 73 includes opposite ends formed with two inclined portions 74 extending in the longitudinal direction of the substrate 1. Each of the inclined portions 74 is so inclined as to come close to the resin package 5 as proceeding toward the outer end thereof. In the infrared data communication module A1, the resin package 5 is held by the rear plate 71 and the press plate 73.

In this embodiment, the rear plate 71 is further formed with two embossed portions 71a and 71b. The two inclined portions 74 are also formed with embossed portions 74a and 74b, respectively. As shown in FIG. 2, the position of the embossed portion 71a of the rear plate 71 and the position of the embossed portion 74a of the inclined portion 74 in the right and left direction in the figure correspond to the position of the top 51c of the lens portion 51. Similarly, the position of the embossed portion 71b and the position of the embossed portion 74b in the right and left direction in the figure correspond to the position of the top 52c of the lens portion 52. In manufacturing the infrared data communication module A1, an integral unit of the substrate 1, the light emitting element 2, the light receiving element 3, the drive IC 4 and the resin package 5 is inserted into the shield cover 7. In this process, the embossed portions 71a, 71b, 74a and 74b facilitate the positioning and prevent the resin package 5 from being flawed by the shield cover 7.

As shown in FIGS. 1 and 2, the top plate 72 is formed with four embossed portions 72a projecting toward the resin package 5. As shown in FIG. 4, space having the same height as that of the embossed portions 72a is defined between the top plate 72 and the resin package 5. This space is loaded with an adhesive 84, whereby the shield cover 7 and the resin package 5 are bonded together.

As shown in FIGS. 1 and 2, the two side plates 75 are connected to opposite ends of the rear plate 71. The two side plates 75 cover opposite end surfaces of the resin package 5. Each of the side plates 75 is formed with a ground terminal 76 for ground connection. As shown in FIGS. 1 and 2, each of the ground terminals 76 extends from the lower end of the side plate 75 in the longitudinal direction of the substrate 1. The ground terminal 76 is connected, via solder, to a pad Pg of the wiring pattern formed on a circuit board C shown in FIG. 1. With this arrangement, when so-called electromagnetic shield effect is exhibited, slight current generated at the shield cover 7 reliably escapes to a non-illustrated grounding electrode. As shown in FIGS. 1 and 2, in the width direction of the substrate 1, both of the ground terminals 76 are provided at positions offset toward the opposite side of the groove conductor layer 6F, i.e., toward the rear plate 71 on the opposite side of the main terminals 6G. Each of the two side plates 75 is formed with a tongue 75a. The tongues 75a serve to prevent the resin package 5 from unduly moving in the longitudinal direction relative to the shield cover 7.

An example of a method for manufacturing the infrared data communication module A1 will be described below.

Figure 7:
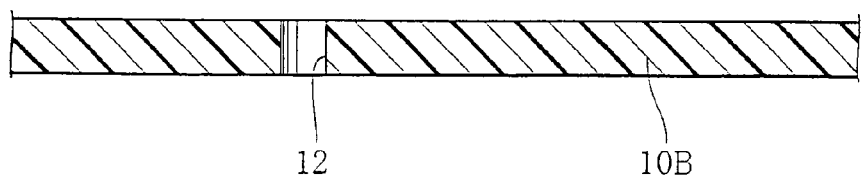
FIG. 7 is a sectional view showing a substrate material used for a method for manufacturing the infrared data communication module according to the first embodiment of the present invention.

First, as shown in FIG. 7, a substrate material 10B is prepared. The substrate material 10B is made of resin such as glass-fiber-reinforced epoxy resin. The substrate material 10B has a size capable of producing a plurality of infrared data communication module A1. However, FIGS. 7-14 show a member which is capable of producing at least one infrared data communication module A1 shown in FIGS. 1-6. A through-hole 12 is formed at the substrate material 10B by machining, for example.

Figure 8:
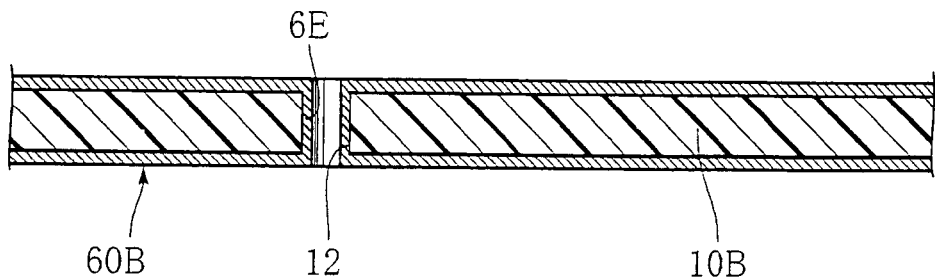
FIG. 8 is a sectional view showing the step of forming a conductor layer in the method for manufacturing the infrared data communication module according to the first embodiment of the present invention.

Then, as shown in FIG. 8, a conductor layer 60B is formed. The conductor layer 60B may be formed by plating using Cu. The conductor layer 60B covers the upper and the lower surfaces of the substrate material 10B and the inner surface of the through-hole 12. The portion of the conductor layer 60B which covers the inner surface of the through-hole 12 is the through-hole conductor layer 6E.

Figure 9:
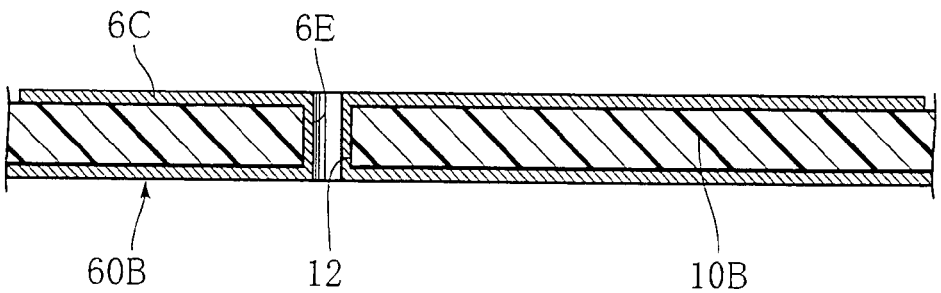
FIG. 9 is a sectional view showing the step of patterning the conductor layer in the method for manufacturing the infrared data communication module according to the first-embodiment of the present invention.

After the conductor layer 60B is formed, a heat dissipating conductor layer 6C is formed, as shown in FIG. 9. The heat dissipating conductor layer 6C may be formed by patterning the portion of the conductive layer 60B which covers the upper surface of the substrate material 1 by etching. As shown in FIG. 5, the heat dissipating conductor layer 6C formed in this way is in the form of an elongated rectangle slightly smaller than the outer shape of the substrate 1. For instance, when the infrared data communication module A1 shown in FIG. 4 needs to have a through-hole penetrating through the first layer 1A and the second layer 1B, the heat dissipating conductor layer 6C is so formed as to avoid the formation portion of the through-hole. By etching, the heat dissipating conductor layer 6C covering most part of the substrate 1 in such a manner as to overlap the light emitting element 2, the light receiving element 3 and the drive IC 4 in a plan view as shown in FIG. 5 can be formed while properly avoiding the formation portion of the through-hole and so on.

Figure 10:
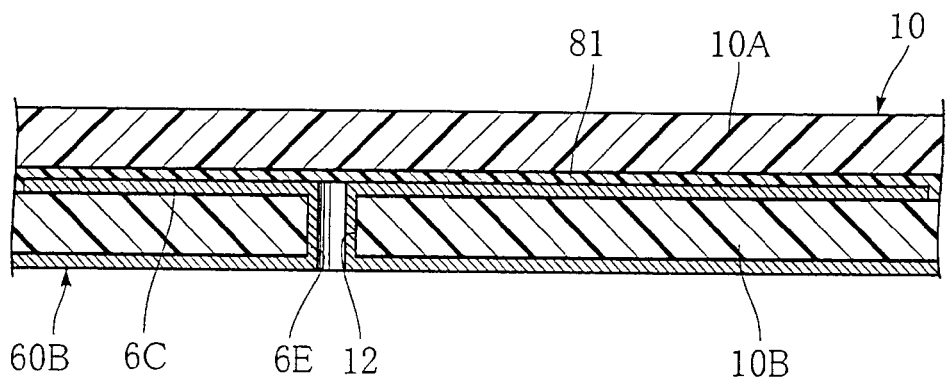
FIG. 10 is a sectional view showing the step of bonding the substrate materials together in the method for manufacturing the infrared data communication module according to the first embodiment of the present invention.

Then, as shown in FIG. 10, a substrate material 10A is prepared, and the substrate material 10A and the substrate material 10B are bonded together. Similarly to the substrate material 10B, the substrate material 10A is made of resin such as glass-fiber-reinforced epoxy resin and has a size capable of producing a plurality of infrared data communication modules A1. The substrate material 10A and the substrate material 10B are bonded using an adhesive 81. Specifically, in this bonding process, the surface of the substrate material 10B which is formed with the heat dissipating conductor layer 6C is oriented upward in the figure, and this surface is bonded to the lower surface of the substrate 10A. As a result, a laminated substrate material 10 made up of the substrate material 10A and the substrate material 10B which are laminated via the heat dissipating conductor layer 6C is obtained.

Figure 11:
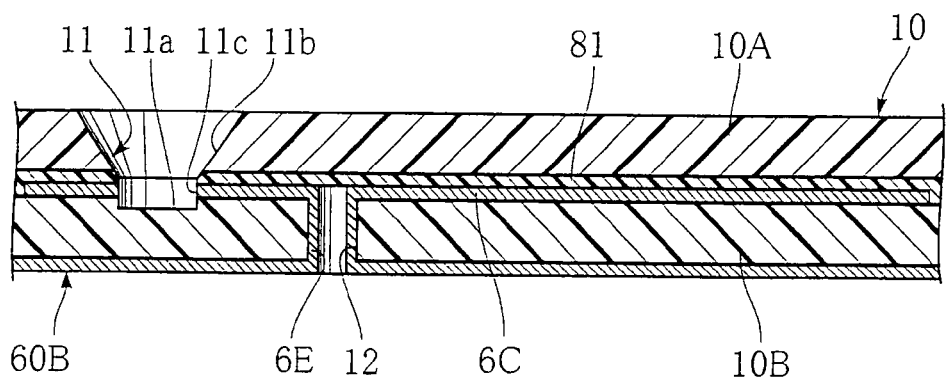
FIG. 11 is a sectional view showing the step of forming a recess in the method for manufacturing the infrared data communication module according to the first embodiment of the present invention.

After the laminated substrate material 10 is formed, a recess 11 is made, as shown in FIG. 11. The formation of the recess 11 may be performed by machining using a cylindrical drill and then a cone drill. In this process, initial working to dig the laminated substrate material 10 is performed from the upper side in the figure until the cylindrical drill penetrates through the substrate material 10A, the adhesive 81 and the heat dissipating conductor layer 6C to reach the substrate material 10B. The recess 11 formed in this way includes a bottom 11a reaching the substrate material 10B and further includes a first side surface 11b and a second side surface 11c. By this machining, a hole, as a part of the recess 11, is formed in the heat dissipating conductor layer 6C. As readily seen, this hole is properly formed in the layer 6C by the above-described machining when the heat dissipating conductor layer 6C is formed to be larger than the recess 11 in the plan view of FIG. 5 in the formation step shown in FIG. 9.

Figure 12:
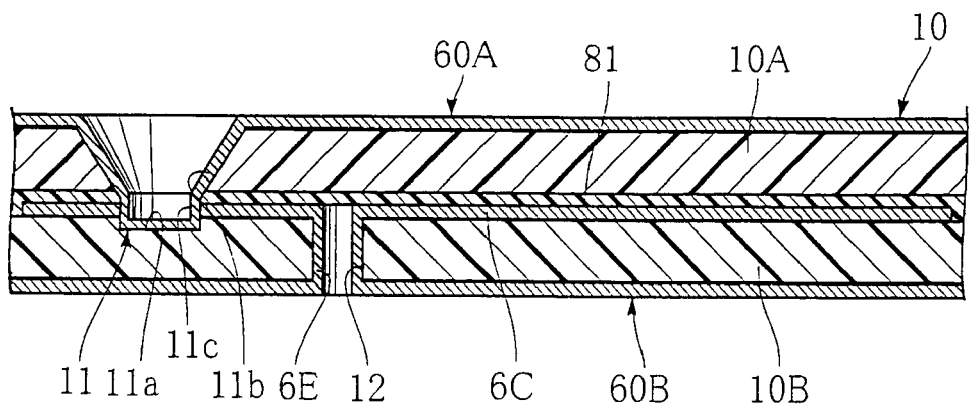
FIG. 12 is a sectional view showing the step of forming a conductor layer in the method for manufacturing the infrared data communication module according to the first embodiment of the present invention.

After the recess 11 is formed, a conductor layer 60A is formed, as shown in FIG. 12. Specifically, the conductor layer 60A is formed by successively performing Cu plating, Ni plating and Au plating so as to cover the upper surface of the substrate material 10A and the recess 11. The Cu plating, Ni plating and Au plating are performed to provide the thicknesses of about 5 μm, 5 μm and 0.5 μm, respectively. As a result, the conductor layer 60A has a laminated structure made up of a Cu layer, an Ni layer and an Au layer. In forming the conductor layer 60A, the heat dissipating conductor layer 6C is exposed at part of the second side surface 11c of the recess 11. Therefore, when the conductor layer 60A is formed by plating, the conductor layer 60A is connected to the exposed portion of the heat dissipating conductor layer 6C. In this way, with the manufacturing method of this embodiment, the conductor layer 60A and the heat dissipating conductor layer 6C are reliably connected to each other, so that the manufacturing method ensures electrical connection and good heat conduction between these members. For reliable electrical connection and good heat conduction between the conductor layer 60A and the heat dissipating conductor layer 6C, it is preferable that the recess 11 penetrates through the heat dissipating conductor layer 6C. However, in forming the recess 11 shown in FIG. 11, it is only necessary that the end of the recess 11 at least reaches the heat dissipating conductor layer 6C. By this, the conductor layer 60A and the heat dissipating conductor layer 6C can be at least connected to each other.

Figure 13:
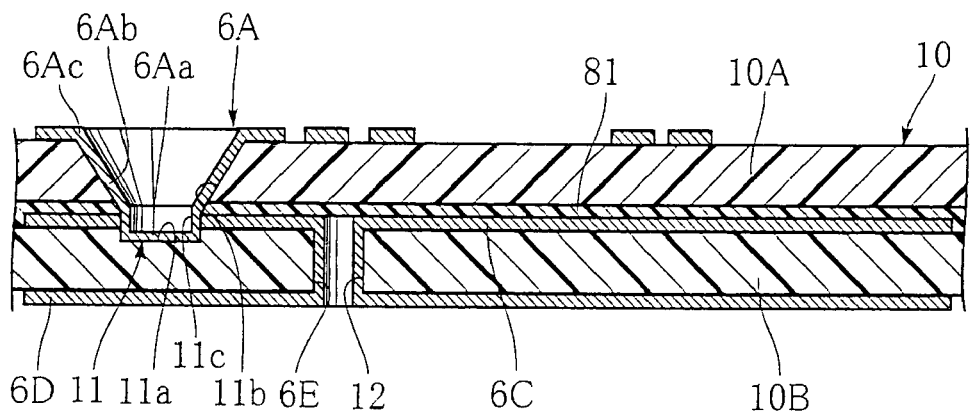
FIG. 13 is a sectional view showing the step of patterning the conductor layer in the method for manufacturing the infrared data communication module according to the first embodiment of the present invention.

Then, by performing patterning with respect to the conductor layer 60A, the bonding conductor layer 6A and other wiring pattern are formed, as shown in FIG. 13. In this patterning process, of the conductor layer 60A shown in FIG. 12, the portion covering the recess 11 and the portion surrounding the recess 11 are left. As a result, the bonding conductor layer 6A including a bottom 6Aa, an inclined surface portion 6Ab and a collar portion 6Ac is formed. Further, by performing patterning with respect to the lower surface of the conductor layer 60B shown in FIG. 12, the heat dissipating conductor layer 6D shown in FIG. 13 is formed.

Figure 14:
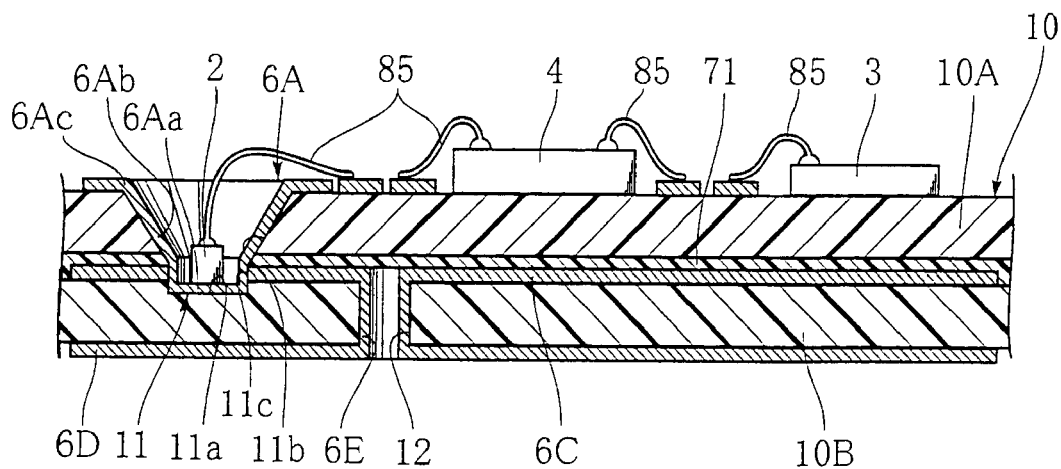
FIG. 14 is a sectional view showing the step of mounting element groups in the method for manufacturing the infrared data communication module according to the first embodiment of the present invention.

After the bonding conductor layer 6A is formed, a light emitting element 2, a light receiving element 3 and a drive IC 4 are mounted, as shown in FIG. 14. For instance, the light emitting element 2 is bonded to the bottom 6Aa of the bonding conductor layer 6A via e.g. conductive resin. Then, by the wire bonding technique, the upper surface of the light emitting element 2 and the wiring pattern formed on the substrate material 10A are connected to each other via a wire 85. Similarly, the light receiving element 3 and the drive IC 4 are mounted on the substrate material 10A, and the upper surfaces of these elements and the above-described wiring pattern are connected to each other via a wire 85.

Figure 15:
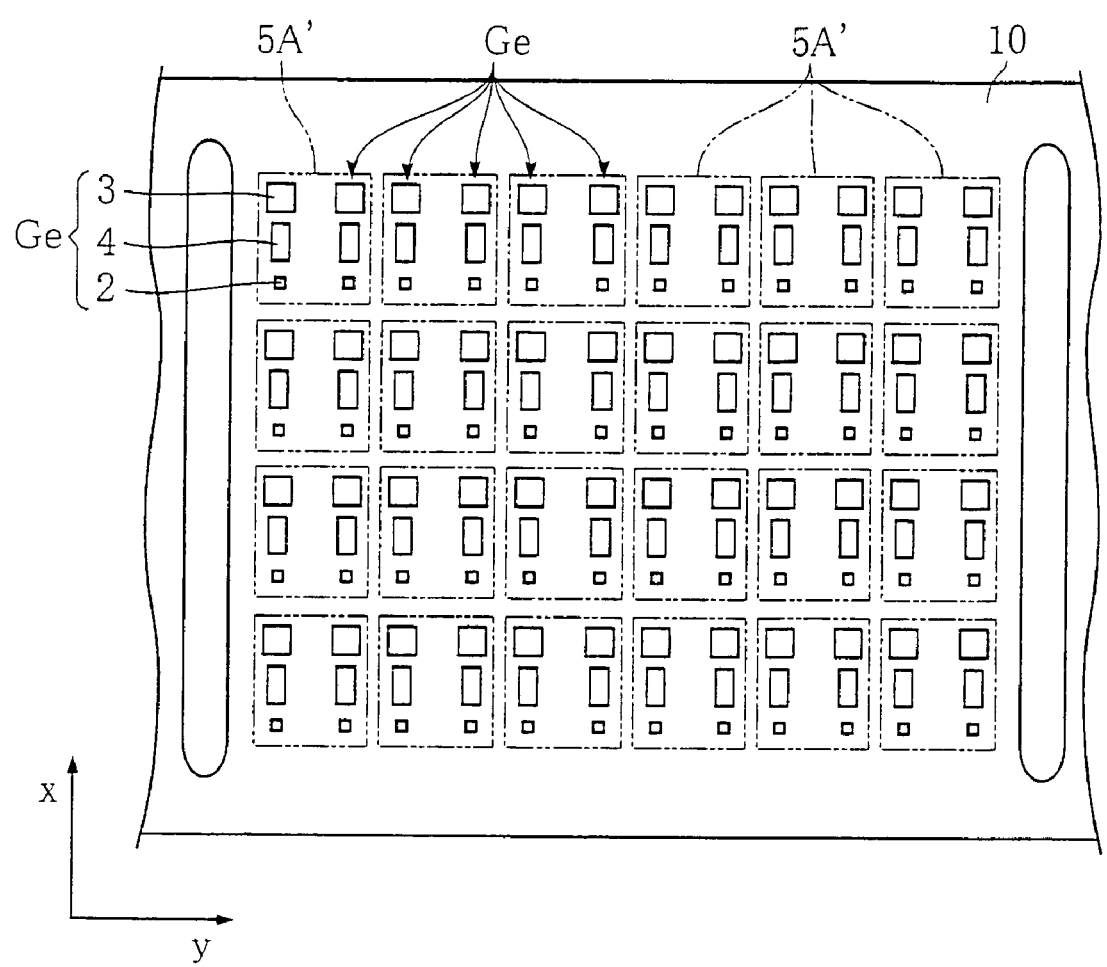
FIG. 15 is a plan view showing a laminated substrate material on which the element groups are mounted in the method for manufacturing the infrared data communication module according to the first embodiment of the present invention.

FIG. 15 shows a laminated substrate material 10 on which a plurality of element groups G3 are mounted. The laminated substrate material shown in the figure includes twenty-four regions 5A' at which resin-molded bodies are to be formed. The resin-molded body formation regions 5A' are arranged in four rows in the direction x (first direction in the present invention) and six columns in the direction y (second direction in the present invention). Two element groups Ge are mounted in each of the resin-molded body formation regions 5A'. In mounting each of the element groups Ge, the light emitting element 2, the drive IC 4 and the light receiving element 3 are arranged in series along the direction x. Further, the two element groups Ge in each region are arranged to be spaced from each other in the direction y. The two element groups Ge are positioned within each of the resin-molded body formation regions 5A' indicated by imaginary lines as a rectangle in the figure. The mounting of the element groups Ge may be performed by die bonding.

Figure 16:
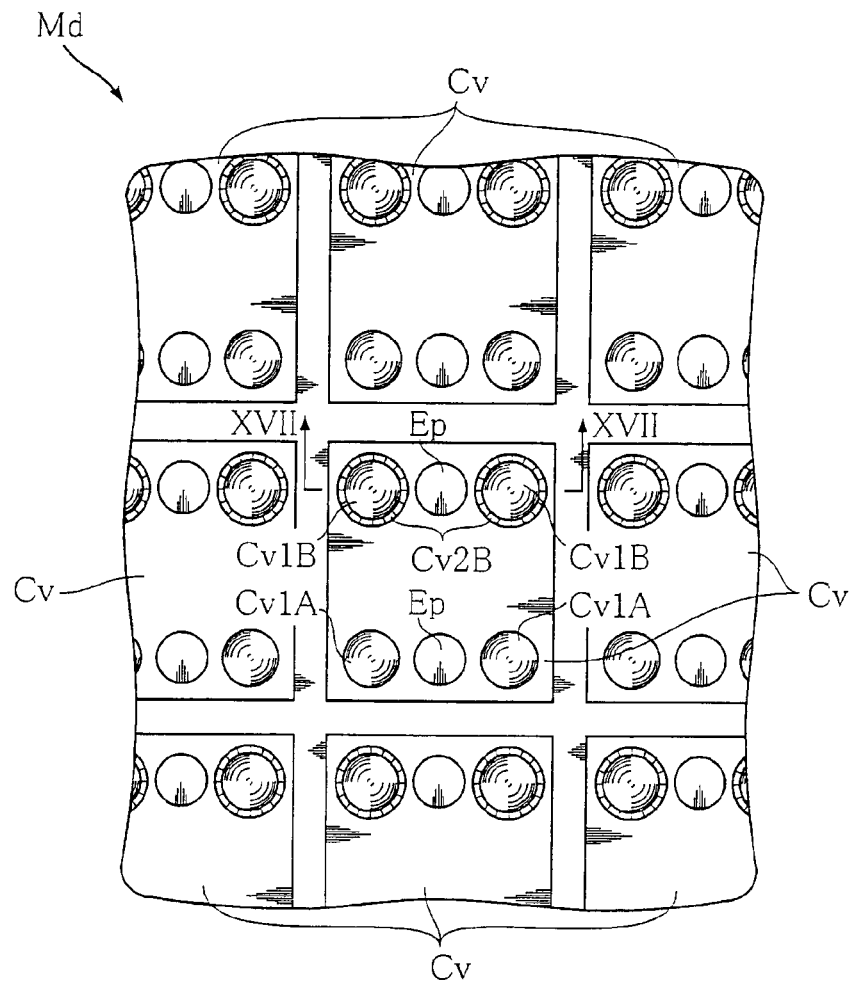
FIG. 16 is a plan view showing a mold used in the method for manufacturing the infrared data communication module according to the first embodiment of the present invention.
Figure 19:
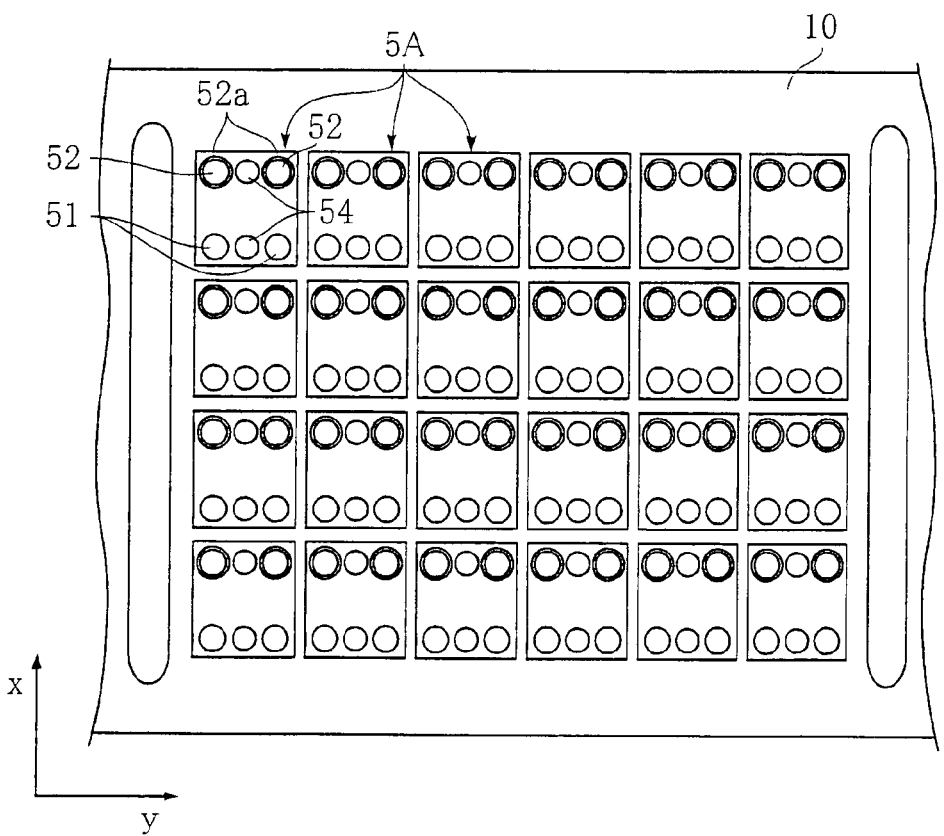
FIG. 19 is a plan view showing a laminated substrate material on which a plurality of resin-molded bodies are formed in the method for manufacturing the infrared data communication module according to the first embodiment of the present invention.

Then, resin-molded bodies 5A shown in FIG. 19 are formed at the resin-molded body formation regions 5A'. The formation of the resin-molded bodies 5A is performed by transfer molding. FIG. 16 shows a mold Md used for the transfer molding. This figure shows the mold Md viewed from the opening side. The mold MD includes a plurality of cavities Cv arranged in matrix. Each of the cavities Cv is a recess which is generally in the form of a rectangular parallelepiped and serves to form the resin-molded body 5A shown in FIG. 19. As shown in FIG. 16, the cavity Cv is formed with two dome-shaped recesses Cv1A and two dome-shaped recesses Cv1B. The recesses Cv1A and the recesses Cv1B are portions to respectively form the lens portions 51 and the lens portions 52 shown in FIG. 19. As shown in FIG. 16, each of the recesses Cv1B is surrounded by an inclined portion Cv2B. The inclined portion Cv2B is a portion to form the inclined portion 52a shown in FIG. 19. Each cavity Cv of the mold Md is provided with two ejector pins Ep. The two ejector pins Ep includes one positioned between two recesses Cv1A and one positioned between two recesses Cv1B.

Figure 17:
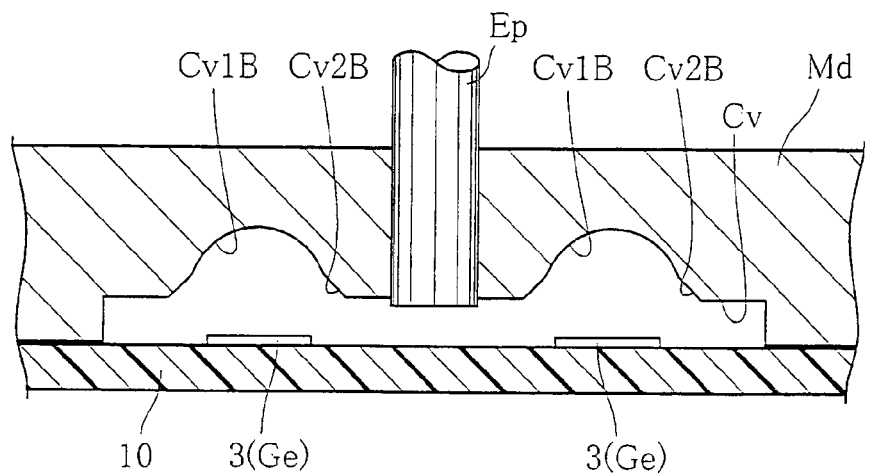
FIG. 17 is a sectional view taken along lines XVII-XVII in FIG. 16.
Figure 18:
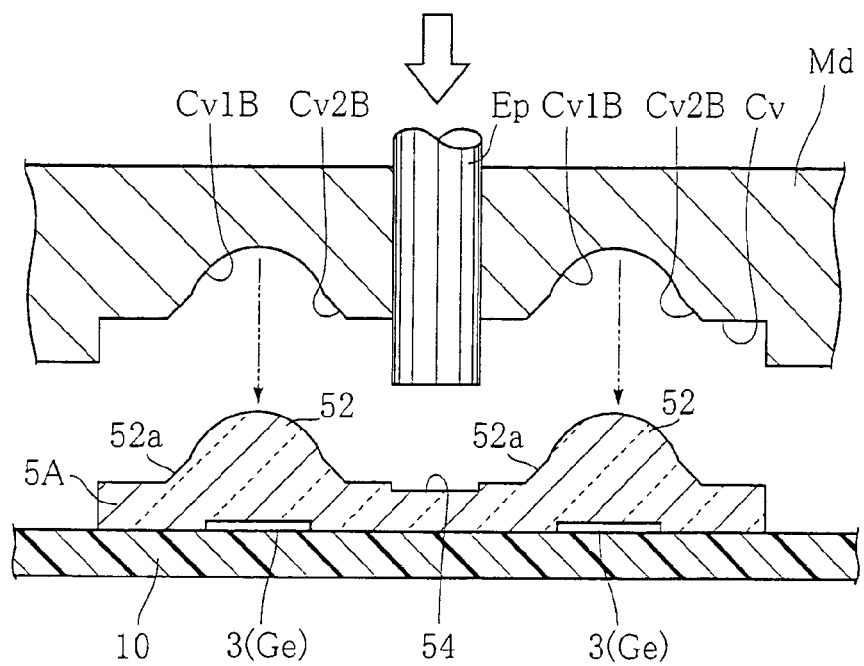
FIG. 18 is a sectional view showing the step of removing a resin-molded body from the mold in the method for manufacturing the infrared data communication module according to the first embodiment of the present invention.

To form the resin-molded body 5A, the mold Md is pressed against the laminated substrate material 10, as shown in FIG. 17. FIG. 17 shows the cross section of the mold Md and the laminated substrate material 10 taken along lines XVII-XVII in FIG. 16. Two element groups Ge are accommodated in each of the cavities Cv. In this state, resin material is loaded into the cavity Cv. By hardening the resin material, the resin-molded body 5A shown in FIG. 18 is obtained. Due to the presence of the recesses Cv1A, Cv1B and the inclined portion Cv2B at the cavity Cv, lens portions 51, 52 and the inclined portion 52a are formed at the resin-molded body 5A. It is to be noted that the illustration of the lamination structure of the laminated substrate material 10 is omitted in FIGS. 17 and 18.

After the resin material is hardened, the resin-molded body 5A is removed from the mold Md by moving the ejector pin Ep downward in the figure. In this way, as shown in FIG. 19, a plurality of resin-molded bodies 5A are formed on the laminated substrate material 10.

Figure 20:
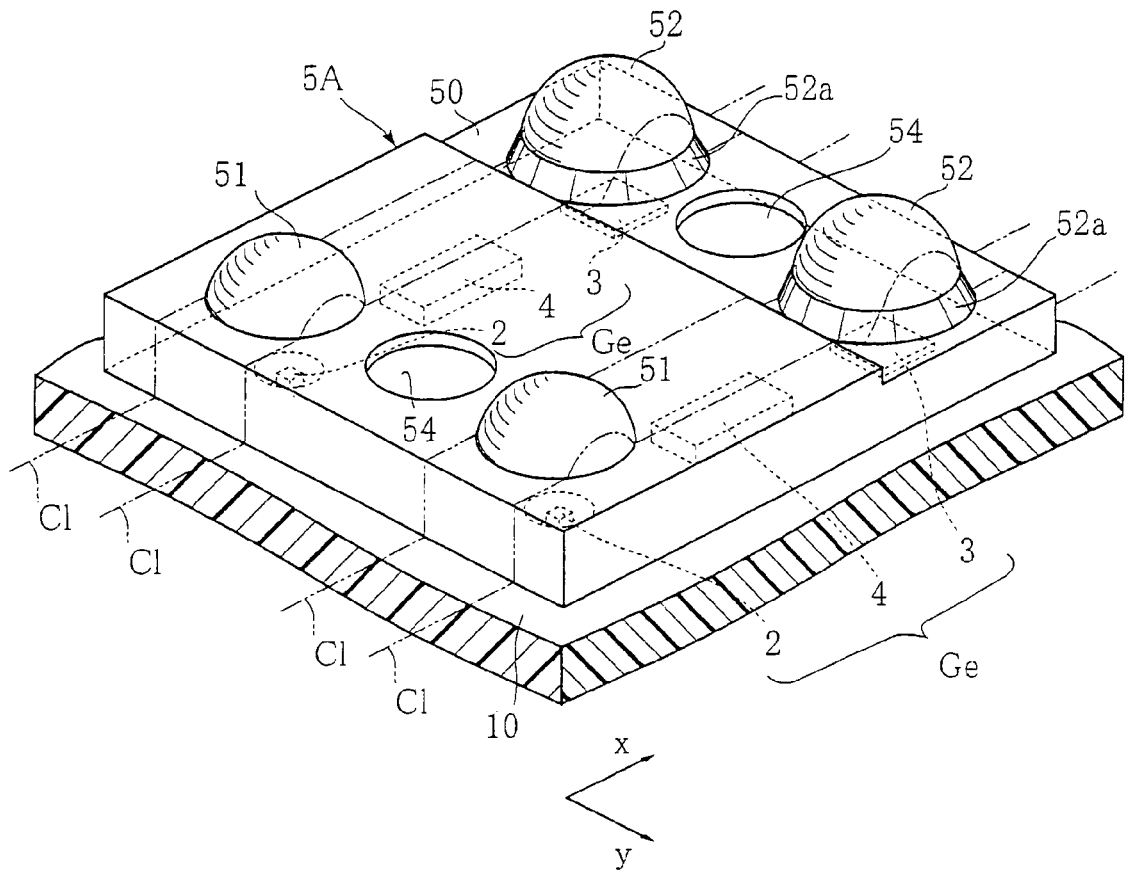
FIG. 20 is a perspective view showing a principal portion of the resin-molded body in the method for manufacturing the infrared data communication module according to the first embodiment of the present invention.

As shown in FIG. 20, the lens portions 51, 52 of the resin-molded body 5A formed in this way have a periphery which is close to a perfect circle. The inclined portion 52a formed is in the form of a ring surrounding the entirety of the lens portion 52. Traces 54 of the ejector pins are left between the two lens portions 51 as well as between the two lens portions 52. The ejector pin traces 54 are the portions against which the ejector pins Ep are pressed in removing the resin-molded body 5A from the mold Md as described above. That is, the force for removing the resin-molded body 5A is applied to the position of the ejector pin traces.

Thereafter, the laminated substrate material 10 and the resin-molded body 5A are cut. Specifically, the cutting is performed along the cutting lines Cl shown in FIG. 20. As a result, the resin-molded body 5A is cut into portions each including a single element group Ge. In this embodiment, the portion of the resin-molded body 5A which includes the ejector pin traces 54 is disposed of. Therefore, the ejector pin trace 54 does not remain at the infrared data communication module A1. Further, cutting along cutting lines (not shown) extending in the direction y is performed. By these cutting steps, each resin-molded body 5A is divided into two resin packages 5, and the laminated substrate material 10 is divided into a plurality of substrates 1. Meanwhile, a plurality of shield covers 7 as shown in FIG. 1 are formed by cutting and bending a metal plate. Each shield cover 7 is bonded to a respective one of the resin packages 5 on the substrates 1. As a result, a plurality of infrared data communication modules A1 shown in FIG. 1 are obtained.

The advantages of the infrared data communication module A1 will be described below.

According to this embodiment, the heat generated due to the energization of the light emitting element 2 is properly dissipated. Specifically, as shown in FIG. 4, the upper portion and side portion of the light emitting element 2 is covered by the resin package 5 having a relatively low thermal conductivity. Therefore, most of the heat generated at the light emitting element 2 is transferred to the bonding conductor layer 6A having a relatively high thermal conductivity. Since the bonding conductor layer 6A is connected to the heat dissipating conductor layer 6C, the heat is transferred from the bonding conductor layer 6A to the heat dissipating conductor layer 6C. Therefore, the heat is prevented from being held around the light emitting element 2, so that the infrared data communication module A1 is prevented from being heated to an excessively high temperature. Therefore, it is possible to increase the power supply to the light emitting element 2 to increase the output so that the amount of light of the infrared data communication module is increased. Therefore, the infrared data communication module A1 is suitable not only for use for data communication but also for use for remote control.

Since the recess 11 penetrates through the heat dissipating conductor layer 6C, the heat dissipating conductor layer 6C is connected to the inclined surface portion 6Ab of the bonding conductor layer 6A in a crossing manner. With this arrangement, the heat dissipating conductor layer 6C and the bonding conductor layer 6A are reliably connected to each other, so that the thermal conduction between these layers is advantageously enhanced.

In this embodiment, as shown in FIG. 5, the heat dissipating conductor layer 6C is large enough to overlap the light emitting element 2, the light receiving element 3 and the drive IC 4. In this manner, the heat dissipating conductor layer 6C has a large heat capacity, which allows heat to readily escape from the light emitting element 2 to the heat dissipating conductor layer 6C via the bonding conductor layer 6A. This is advantageous for achieving the above-described increase in power supply. It is to be noted that, when the heat dissipating conductor layer 6C is at least larger than the recess 11, the connection of the bonding conductor layer 6A and the heat dissipating conductor layer 6C is easily achieved.

The heat transferred to the heat dissipating conductor layer 6C is transferred to the heat dissipating conductor layer 6D via the through-hole conductor layer 6E. As shown in FIGS. 4 and 6, the heat dissipating conductor layer 6D is provided on the lower surface of the substrate 1 and has a high heat transfer efficiency with respect to the atmosphere. Therefore, the heat transferred to the heat dissipating conductor layer 6C and then transferred to the heat dissipating conductor layer 6D is properly dissipated to the outside of the infrared data communication module A1. In this embodiment, as shown in FIG. 6, heat is also transferred from the bonding conductor layer 6A to the heat dissipating conductor layer 6D via the groove conductor layer 6F. This is also advantageous for dissipating heat generated at the light emitting element 2 to the outside of the infrared data communication module A1.

Since the heat dissipating conductor layers 6C, 6D, the through-hole conductor layer 6E and the groove conductor layer 6F are made of Cu or Cu alloy having a relatively high thermal conductivity, the heat dissipation effect is advantageously promoted.

According to the experiment performed by the inventors, the amount of heat dissipation per unit time of the infrared data communication module A1 according to this embodiment was about twice that of an infrared data communication module having the conventional structure. For instance, when electric current of 200 mA was supplied to the light emitting element 2, the temperature around the light emitting element 2 was not lower than 80° C. in the conventional infrared data communication module. However, in the infrared data communication module A1 of this embodiment, the temperature was about 65° C. owing to the excellent heat dissipation. The light emitting element 2 is generally used for the infrared data communication module A1 for data communication. However, when it is possible to supply a large amount of current of e.g. 200 mA, infrared rays sufficient for controlling an electronic apparatus several meters away from the infrared data communication module A1 can be emitted. Therefore, by mounting the infrared data communication module A1 to e.g. a cell phone, it is possible to remotely control an electronic apparatus using the cell phone.

Further, according to this embodiment, the infrared rays emitted from the light emitting element 2 are efficiently guided to the outside. The first side surface 11b of the recess 11, which is positioned on the upper side in FIG. 4, is a so-called tapered surface. The infrared rays emitted from the light emitting element 2 obliquely upward at a relatively shallow angle travel toward the first side surface 11b. The infrared rays are reflected toward the lens portion 51 by the inclined surface portion 6Ab of the bonding conductor layer 6A covering the first side surface 11b. Therefore, large part of the infrared rays emitted from the light emitting element 2 is guided to the outside of the infrared data communication module A1 through the lens portion 51. Particularly, the angle of inclination $\gamma_1$ of the first side surface 11b with respect to the optical axis $Op_1$ is 35°. This is advantageous for efficiently reflecting the infrared rays from the light emitting element 2 upward in the figure. To properly reflect the infrared rays, it is preferable that the angle of inclination $\gamma_1$ is 30 to 40°.

The side surface of the recess 11 consists solely of the first side surface 11b and the second side surface 11c. Therefore, the area of the first side surface 11b can be made large so that a large amount of infrared rays L is advantageously reflected upward in the figure.

Further, the structure according to this embodiment ensures the size reduction of the infrared data communication module A1. Generally, referring to FIG. 4, light is actually emitted from upper one-third part of the light emitting element 2 and is hardly emitted from lower two-third part of the light emitting element 2. In this embodiment, the lower two-third part is surrounded by the cylindrical second side surface 11c. Therefore, the dimension of the recess 11 in plan view is reduced by as much as the first side surface 11c. Accordingly, as shown in FIG. 5, the space of the recess 11 on the substrate 1 is reduced. Therefore, the dimension of the substrate 1 in the vertical direction in the figure (the width) can be made small, which is advantageous for reducing the size of the infrared data communication module A1.

Since the first side surface 11b is covered by the inclined surface portion 6Ab of the bonding conductor layer 6A, the first side surface 11b functions as a reflection surface having a relatively high reflectivity. Such a reflection surface is suitable for preventing the attenuation in reflecting the infrared rays from the light emitting element 2 and advantageously enhances the light emission efficiency of the infrared rays traveling from the light emitting element 2.

As shown in FIG. 3, according to this embodiment, between the lens portion 52 and the surface 50 exists the inclined portion 52a, and a generally right-angled corner, for example, does not exist. Therefore, in the process step of removing the resin-molded body 5A shown in FIG. 18, excessively large stress is not generated at the root of the lens portion 52. Therefore, the formation of a crack at the root of the lens portion 52 is prevented.

To prevent a crack, it is preferable that the angle of inclination $\alpha$ of the inclined portion 52a shown in FIG. 4 is 45°. To reliably exhibit the crack prevention effect, it is preferable that the angle of inclination $\alpha$ is 40 to 50°.

As shown in FIG. 4, when the size of the inclined portion 52a is so set that the angle $\theta$ does not exceed 20°, the surface area of the lens portion 52 is prevented from becoming unduly small. When the inclined portion 52a is unduly large, the lens portion 52 becomes small. In such a case, it is difficult to properly cause the infrared rays to converge onto the light receiving element 3. The arrangement of this embodiment ensures that the infrared rays are properly converged onto the light receiving element 3, while the formation of a crack is effectively prevented.

As will be understood from FIG. 20, the resin-molded body 5A is removed from the mold Md by pushing the positions of the ejector pin traces 54 by the ejector pins Ep. Therefore, an external force is applied to the ejector pin traces 54. The ejector pin traces 54 are positioned between the two lens portions 51 and between the two lens portions 52. When the external force is applied, the resin-molded body 5A so warps that the portions around the ejector pin traces 54 move downward, with the two lens portions 51 and 52 held. However, the element groups Ge are not arranged below the ejector pins Ep. Therefore, even when the resin-molded body is warped in the above-described manner, a large stress is not applied to the element groups Ge, so that the element groups Ge are properly protected. Particularly, the drive IC 4 is generally in the form of an elongated rectangle and liable to be damaged by deformation. In this embodiment, the ejector pins Ep of the mold Md are so arranged that the ejector pin traces 54 are formed at positions away from the drive IC 4. This arrangement is advantageous for protecting the drive IC 4.

Further, the arrangement according to this embodiment ensures the proper mounting of the infrared data communication module A1. Specifically, to mount the infrared data communication module A1 by reflow soldering, solder paste is applied to the pads Pm, Pg of the circuit board C shown in FIG. 1, and then the infrared data communication module A1 is so placed that the main terminals 6G and the ground terminals 76 adhere to the solder paste. Then, these members are put into a reflow furnace, and the temperature in the furnace is raised. In this process, since the ground terminals 76 project out of the shield cover 7, the temperature of the ground terminals rises quickly as compared with the main terminals 6G and so on. Therefore, the solder paste adhering to the ground terminals 76 melts most quickly. The melted solder paste exhibits so-called self centering effect, i.e., moves each of the two ground terminals 76 toward the center of the pad Pg. In this way, the infrared data communication module A1 is properly positioned by the two ground terminals 76 spaced from each other in the longitudinal direction. Therefore, in FIG. 2, for example, the infrared data communication module A1 is prevented from unduly rotating around the center. Thus, the infrared data communication module A1 is mounted at the proper position, and hence, properly exhibits the function.

In the reflow soldering process, the two ground terminals 76 are likely to come into contact with the pads Pg of the circuit board C earlier than the main terminals 6G. This is because, the solder paste adhering to the ground terminals 76 melts earlier than the solder paste adhering the main terminals 6G, and the ground terminals 76 sink due to the own weight of the infrared data communication module A1. Since the shield cover 7 is bonded to the resin package 5 using e.g. the adhesive 84, the ground terminals 76 may be positioned slightly lower than the lower surface of the substrate 1. In this case, when the ground terminals 76 and the main terminals 6G are positioned to overlap in the width direction of the substrate 1, the main terminals 6G float above the pads Pm of the circuit board C, so that proper soldering of the main terminals is difficult. In this embodiment, however, the main terminals 6G and the ground terminals 76 are spaced from each other in the width direction of the substrate 1. Therefore, even after the ground terminals 76 come into contact with the pads Pg, the main terminals 6G properly come into contact with the pad Pm when the solder paste adhering to the main terminals 6G melts. Therefore, the infrared data communication module A1 properly exhibits its function.

In this embodiment, the top plate 72, the rear plate 71, two side plates 75 and the press plate 73 of the shield cover 7 cover the four sides and upper side of the resin package 5. With this arrangement, it is possible to properly position the shield cover 7 relative to the resin package 5. Therefore, the two ground terminals 76 are properly positioned relative to the main terminals 6G, which is also advantageous for properly mounting the infrared data communication module A1. Further, by extending out the two ground terminals 76 from different side plates 75, the distance between the two ground terminals 76 is made long. This is advantageous for preventing the infrared data communication module A1 from rotating in the mounting process.

Figure 21:
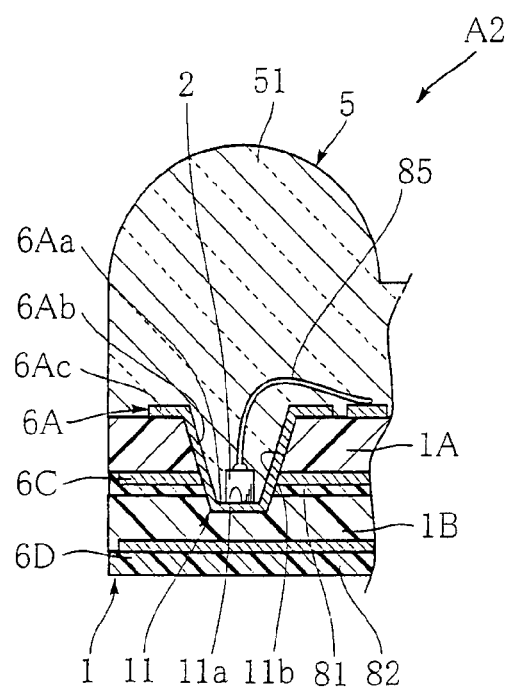
FIG. 21 is a sectional view showing a principal portion of an infrared data communication module according to a second embodiment of the present invention.
Figure 23:
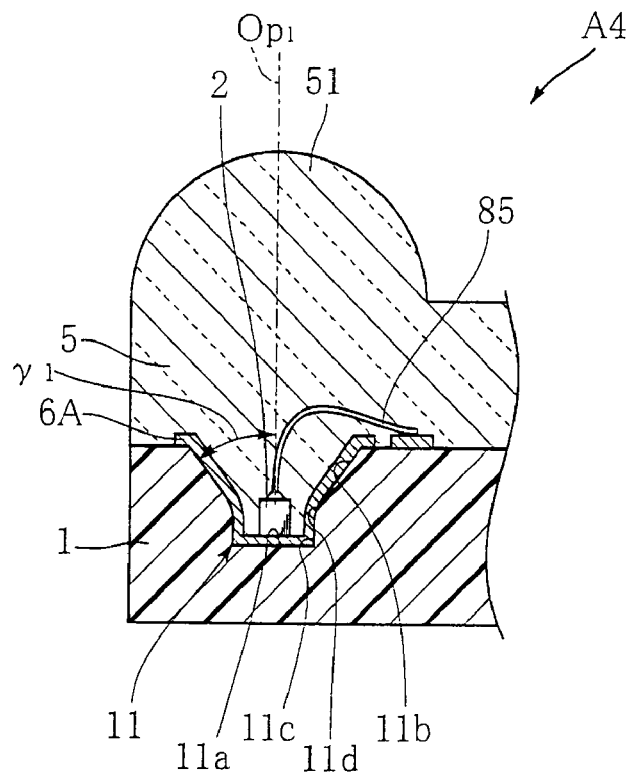
FIG. 23 is a sectional view showing a principal portion of an infrared data communication module according to a fourth embodiment of the present invention.
Figure 24:
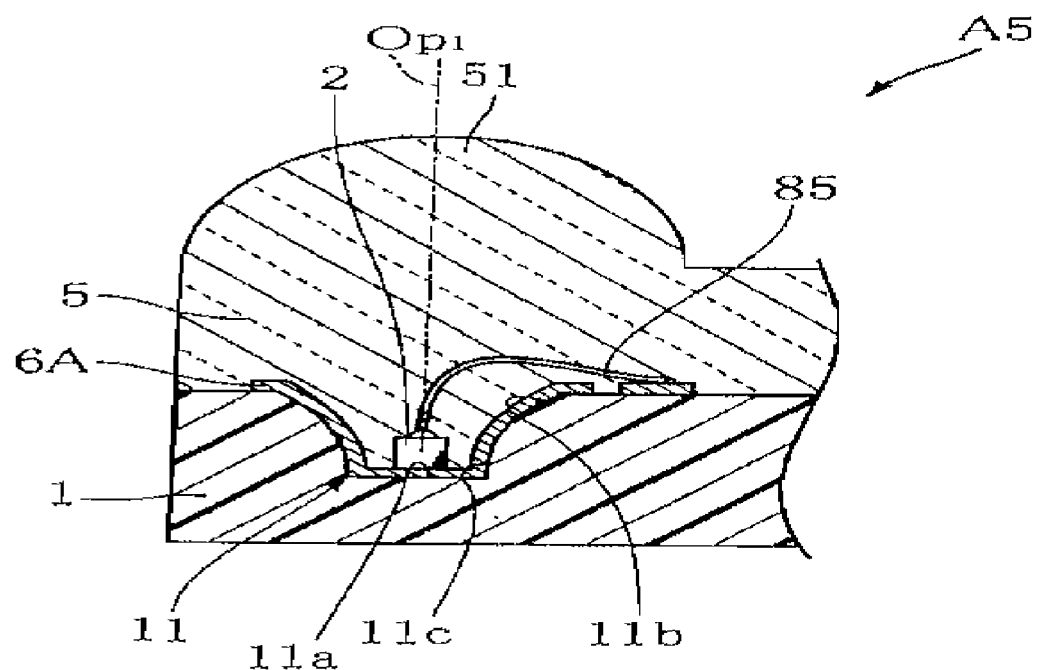
FIG. 24 is a sectional view showing a principal portion of an infrared data communication module according to a fifth embodiment of the present invention.
Figure 25:
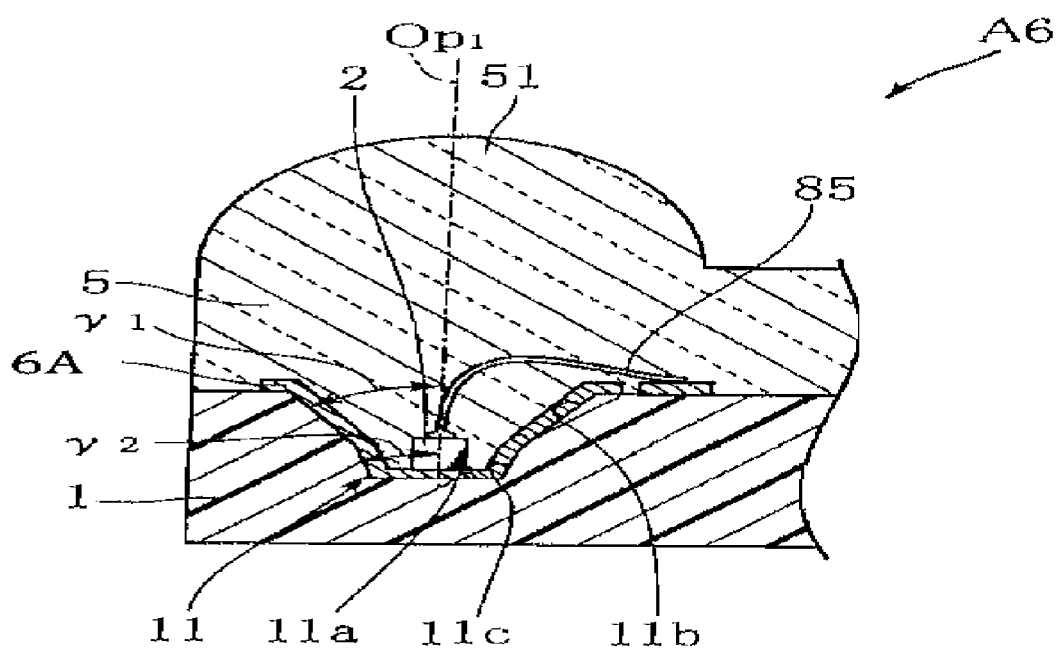
FIG. 25 is a sectional view showing a principal portion of an infrared data communication module according to a sixth embodiment of the present invention.

FIG. 21 and the subsequent figures show other examples of infrared data communication module according to the present invention. In these figures, the elements which are identical or similar to those of the foregoing embodiment are designated by the same reference signs, ad the description thereof is omitted appropriately. In FIGS. 21-26, the illustration of the shield cover 7 is omitted for convenience. In FIGS. 23-25, the illustration of the lamination structure of the substrate 1 is omitted for convenience.

FIG. 21 shows an infrared data communication module according to a second embodiment of the present invention. The infrared data communication module A2 of this embodiment differs from the foregoing embodiment in that the heat dissipating conductor layer 6C is formed on the lower surface of the first layer 1A. In this embodiment, in the manufacturing process shown in FIGS. 7-14, instead of forming a conductor layer 60B on the upper surface of the substrate material 10B shown in FIG. 8, a conductor layer for forming the heat dissipating conductor layer 6C is formed on the lower surface of the substrate material 10A shown in FIG. 10. With this embodiment again, the bonding conductor layer 6A and the heat dissipating conductor layer 6C are reliably connected to each other, whereby the heat generated from the light emitting element 2 is properly dissipated.

Figure 22:
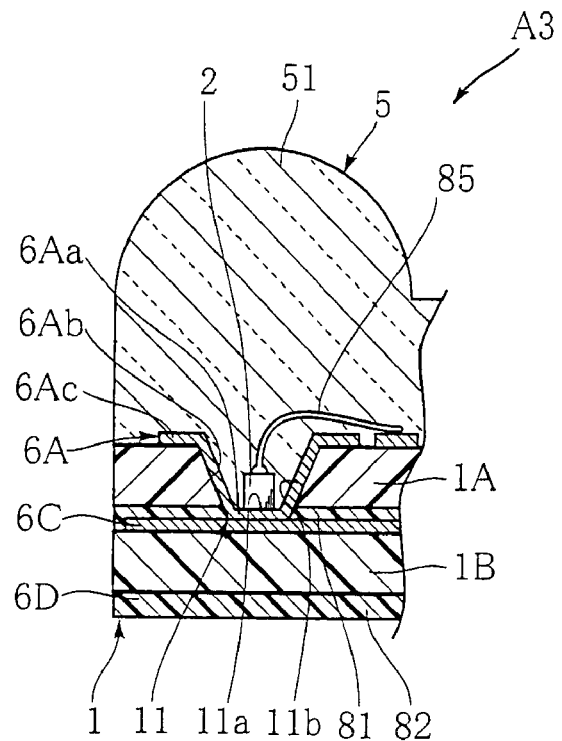
FIG. 22 is a sectional view showing a principal portion of an infrared data communication module according to a third embodiment of the present invention.

FIG. 22 shows an infrared data communication module according to a third embodiment of the present invention. In the infrared data communication module A3 of this embodiment, the recess 11 does not penetrate through the heat dissipating conductor layer 6C. Specifically, the end of the recess 11 reaches the heat dissipating conductor layer 6C but does not reach the second layer 1B. In this embodiment, therefore, the bonding conductor layer 6A and the heat dissipating conductor layer 6C are connected to each other at a relatively large area. Therefore, the heat transfer from the bonding conductor layer 6A to the heat dissipating conductor layer 6C is promoted. To manufacture the infrared data communication module A3, in the manufacturing process shown in FIGS. 7-14, a tapered through-hole is formed at the substrate material 10A before laminating the substrate material 10A on the substrate material 10B. By this process, the recess 11 shown in FIG. 22 is formed properly.

FIG. 23 shows an infrared data communication module according to a fourth embodiment of the present invention. The infrared data communication module A4 shown in the figure differs from the first embodiment in that a third side surface 11d intervenes between the first side surface 11b and the second side surface 11c. The third side surface 11d is a ring-shaped curved surface bulging toward the center of the recess 11. The third side surface 11d is connected to the first side surface 11b and the second side surface 11c in a geometrically continuous state.

According to this embodiment again, the infrared rays from the light emitting element 2 are properly reflected upward, while the size of the infrared data communication module A4 is reduced. When the size of the infrared data communication module A4 is reduced, the size of the light emitting element 2 and the recess 11 is also reduced. However, in view of the machining accuracy, it is sometimes difficult to form a small recess 11 in which the first side surface 11b and the second side surface 11c are directly connected to each other. According to this embodiment, by the provision of the third surface 11d, which is a curved surface, the accuracy required of the machining is alleviated.

FIG. 24 shows an infrared data communication module according to a fifth embodiment of the present invention. The illustrated infrared data communication module A5 of this embodiment differs from the foregoing embodiments in that the first side surface 11b and the second side surface 11c form a continuous curved surface. The first side surface 11b and the second side surface 11c constitute an upper portion and a lower portion of the curved surface. The angle of inclination of the curved surface with respect to the optical axis $Op_1$ reduces as progressing from the upper side toward the lower side in the figure. Therefore, the average angle of inclination of the second side surface 11c with respect to the optical axis $Op_1$ is smaller than that of the first side surface 11b. With this embodiment again, the infrared rays from the light emitting element 2 are properly reflected upward, while the size of the infrared data communication module A5 is reduced.

FIG. 25 shows an infrared data communication module according to a sixth embodiment of the present invention. The infrared data communication module A6 shown in the figure is similar to that of the first embodiment in that the first side surface 11b and the second side surface 11c are directly connected to each other, but different in that the second side surface 11c is inclined with respect to the optical axis $Op_1$. The angle of inclination $\gamma_2$ of the second side surface 11c is smaller than the angle of inclination $\gamma_1$ of the first side surface 11b. According to this embodiment again, the infrared rays from the light emitting element 2 are properly reflected upward, while the size of the infrared data communication module A6 is reduced. The second side surface 11c is flared upward in the figure. Therefore, in bonding the light emitting element 2 on the bottom surface 11a or bonding a wire to the upper surface of the light emitting element 2, undesirable contact with the substrate 1 is avoided.

Figure 26:
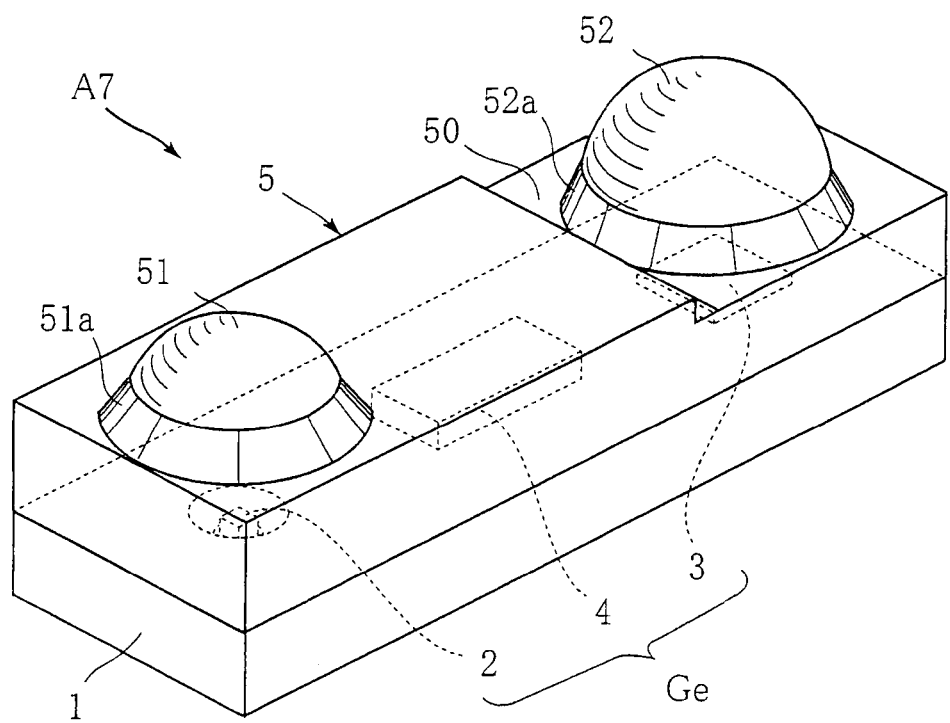
FIG. 26 is a perspective view showing a principal portion of an infrared data communication module according to a seventh embodiment of the present invention.

FIG. 26 shows an infrared data communication module according to a seventh embodiment of the present invention. The infrared data communication module A7 of this embodiment differs from that of the first embodiment in that an inclined portion 51a is provided, and the shape of the inclined portions 51a, 52a is also different. In this embodiment, each of the lens portions 51 and 52 has a periphery which is close to a perfect circle. The inclined portions 51a and 52a comprise inclined surfaces respectively surrounding the lens portions 51 and 52.

With this embodiment again, the formation of a crack near the lens portions 51, 52 is prevented in the manufacturing process. Further, the element groups Ge are protected. For instance, when the lens portion 51 is designed to project largely upward in the figure to enhance the directivity of infrared rays from the light emitting element 2, the prevention of a crack is particularly effective.

Figure 27:
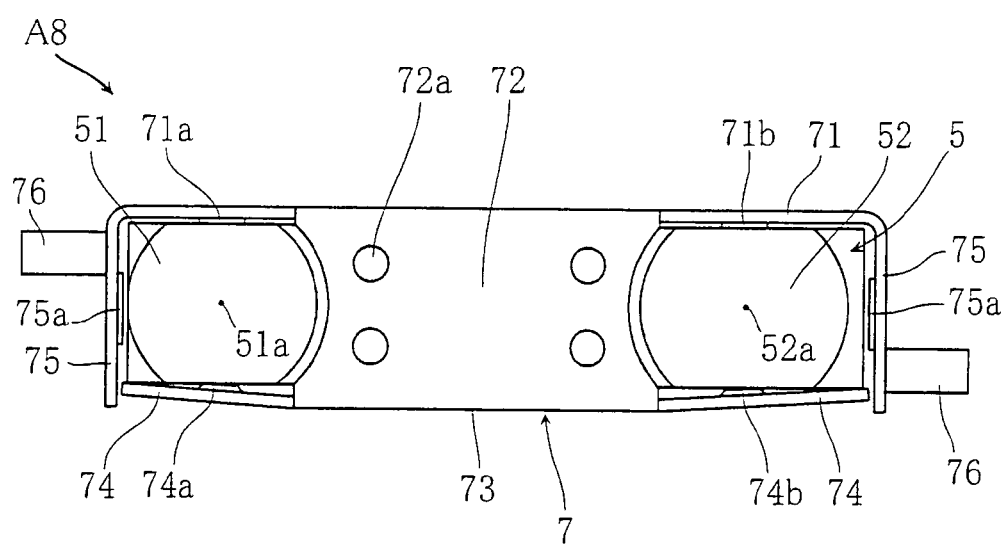
FIG. 27 is a plan view showing an infrared data communication module according to an eighth embodiment of the present invention.
Figure 28:
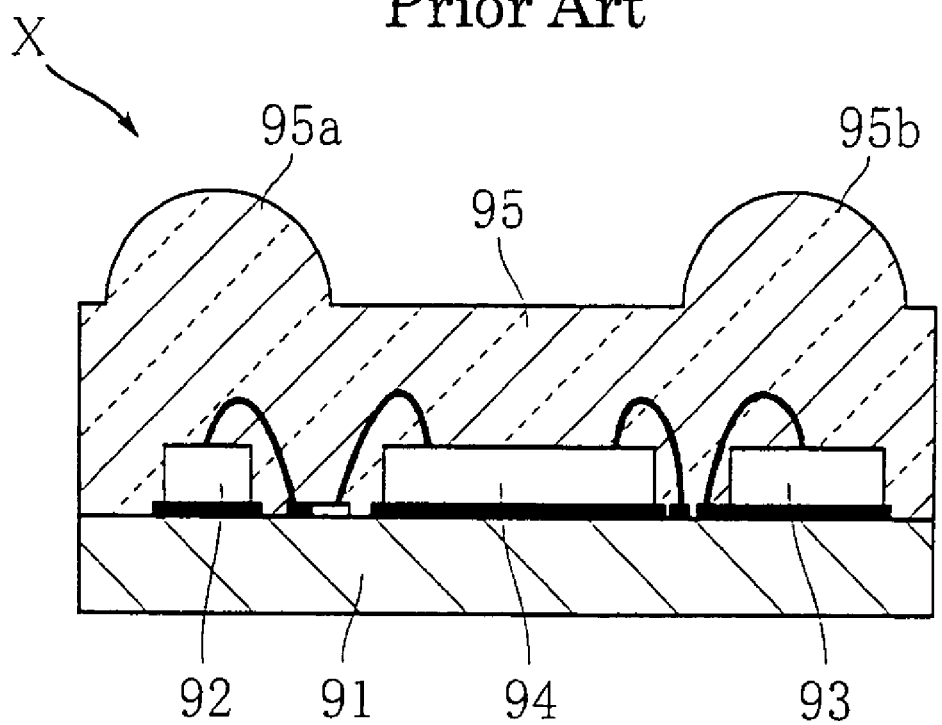
FIG. 28 is a sectional view showing a conventional infrared data communication module.

FIG. 27 shows an infrared data communication module according to an eighth embodiment of the present invention. The infrared data communication module A8 of this embodiment differs from the first embodiment in arrangement of the two ground terminals 76 in the width direction of the substrate 1. In this embodiment, of the two ground terminals 76, the left one in the figure is positioned closer to the rear plate 71 of the shield cover 7, whereas the right one in the figure is positioned closer to the opposite side of the rear plate 71. Similarly to the embodiment shown in FIG. 1, main terminals 6G are formed on the lower side, in the figure, of the infrared data communication module A8. Therefore, the ground terminal 76 on the right side in FIG. 27 is positioned closer to the main terminals 6G.

In this embodiment again, the ground terminals 76 are spaced from each other in the longitudinal direction of the substrate 1. Therefore, in mounting the infrared data communication module A8, positional deviation is avoided. As noted before, when both of the two ground terminals 76 are positioned closer to the rear plate 71 like the foregoing embodiment, the main terminals 6G are advantageously prevented from floating. However, when only one of the ground terminals is positioned closer to the rear plate 71 like this embodiment, the distance between the two ground terminals 76 is increased, which is advantageous for preventing the rotation of the infrared data communication module A8 in the mounting process.

The optical communication module and the manufacturing method therefor according to the present invention are not limited to the foregoing embodiments, and the specific structure of each part may be varied in design in many ways.

The light emitting element and the light receiving element are not limited to those capable of emitting or receiving infrared rays, and those capable of emitting or receiving visible rays may be employed. That is, the optical communication module is not limited to an infrared data communication module but may be one designed to perform communication by utilizing visible rays. Further, the optical communication module is not limited to that capable of performing interactive communication but may be a data transmission module provided with a light emitting element only.

The shape of the recess in cross section is not limited to circular but may be polygonal, for example. The number of element groups included in a resin-molded body is not limited to two but may be three or more. The number of ground terminals is not limited to two but may be three or more.

The invention claimed is:

1. An optical communication module comprising:
a substrate including a first layer and a second layer, the first layer being formed with a recess which has an opening at an obverse surface of the first layer, the second layer being laminated to the first layer on a side opposite from the opening;
a bonding conductor layer covering at least a bottom surface of the recess;
a light emitting element mounted on the bonding conductor layer;
a heat dissipating conductor layer sandwiched between the first layer and the second layer and connected to the bonding conductor layer;
a light receiving element for receiving light; and
a resin package covering the light emitting element and the light receiving element, the resin package including a first lens carrying surface formed with a first dome-shaped lens portion facing one of the light emitting element and the light receiving element, the resin package also including a second lens carrying surface formed with a second lens portion facing the other of the light emitting element and the light receiving element, the first lens carrying surface being located lower than the second lens carrying surface and separated from the second lens carrying surface by an upright wall;
wherein the resin package is formed with an inclined portion connecting the first lens carrying surface of the resin package to a periphery of the first lens portion via a boundary and forming an obtuse angle with respect to the periphery of the first lens portion, an angle of inclination of the inclined portion with respect to the first lens carrying surface being smaller than an angle of inclination of the periphery of the first lens portion adjoining the boundary, a recessed space being defined by the inclined portion, the first lens carrying surface and the upright wall, and
wherein the recessed space includes a bottom surface defined by the first lens carrying surface, the bottom surface of the recessed space being located above the light receiving element.

2. The optical communication module according to claim 1, wherein the heat dissipating conductor layer is made of Cu or Cu alloy.

3. The optical communication module according to claim 1, wherein the recess penetrates through the first layer.

4. The optical communication module according to claim 3, wherein the recess further penetrates through the heat dissipating conductor layer.

5. The optical communication module according to claim 1, wherein the heat dissipating conductor layer is larger than the recess when viewed in a thickness direction of the substrate.

6. The optical communication module according to claim 1, further comprising a through-hole extending from a surface of the second layer on which the heat dissipating conductor layer is formed to a surface of the substrate which is opposite from the opening of the recess, the through-hole including an inner surface formed with a through-hole conductor layer connected to the heat dissipating conductor layer;
wherein an additional heat dissipating conductor layer connected to the through-hole conductor layer is provided on the surface of the substrate which is opposite from the opening of the recess.

7. The optical communication module according to claim 6, wherein the additional heat dissipating conductor layer is made of Cu or Cu alloy.

8. The optical communication module according to claim 1, wherein the recess includes a first side surface having a diameter which increases as progressing from the bottom surface of the recess toward the opening.

9. The optical communication module according to claim 8, wherein the recess includes a second side surface which is positioned closer to the bottom surface than the first side surface is and inclined with respect to an optical axis of the light emitting element at an angle of inclination which is smaller than an angle of inclination of the first side surface.

10. The optical communication module according to claim 9, wherein the first side surface is connected to an obverse surface of the substrate, and the angle of inclination thereof with respect to the optical axis of the light emitting element is constant; and
wherein the second side surface is connected to the bottom surface and tubular along the optical axis of the light emitting element.

11. The optical communication module according to claim 9, wherein the first side surface and the second side surface are directly connected to each other.

12. The optical communication module according to claim 8, wherein an angle of inclination of the first side surface with respect to the optical axis of the light emitting element is 30 to 40°.

13. The optical communication module according to claim 8, wherein at least the first side surface is covered by the bonding conductor layer.

14. The optical communication module according to claim 1, wherein the light emitting element is capable of emitting infrared rays; and
wherein the optical communication module further comprises a drive IC for driving and controlling the light emitting element and the light receiving element to function as an infrared data communication module.

15. The optical communication module according to claim 14, wherein the heat dissipating conductor layer overlaps each of the light emitting element, the light receiving element and the drive IC when viewed in a thickness direction of the substrate.

16. The optical communication module according to claim 1, wherein the angle of inclination of the inclined portion with respect to the first lens carrying surface of the resin package is 40 to 50°.

17. The optical communication module according to claim 1, wherein, when a point of intersection where a plane including the first lens carrying surface of the resin package meets the optical axis of the first lens portion and an arbitrary point on a boundary between the first lens portion and the inclined portion are connected to each other by a straight line, an angle of not larger than 20° is formed between the straight line and the plane including the first lens carrying surface of the resin package.

18. The optical communication module according to claim 1, wherein the substrate is in a form of an elongated rectangle;

wherein the light emitting element and the light receiving element are mounted on the substrate side by side in a longitudinal direction of the substrate;

wherein the light emitting element and the light receiving element are shielded against electromagnetic wave and light by a shield cover; and wherein the shield cover is formed with at least two ground terminals for ground connection, the ground terminals extending out from part of the shield cover and being spaced from each other in the longitudinal direction of the substrate.

19. The optical communication module according to claim 18, wherein the shield cover includes a top plate extending between the first and second lens portions, a rear plate connected to the top plate and facing a side surface of the resin package extending in the longitudinal direction, and two side plates connected to the rear plate and respectively covering longitudinally opposite end surfaces of the resin package;

wherein the two ground terminals extend out from the two side plates in the longitudinal direction of the substrate.

20. The optical communication module according to claim 19, wherein the substrate includes an end surface positioned on an opposite side of the rear plate, the end surface being provided with a main terminal for supplying power and inputting/outputting a control signal with respect to the light emitting element and the light receiving element; and wherein the two ground terminals are located at positions offset toward the rear plate.

21. The optical communication module according to claim 1, wherein the first and second lens portions face the light receiving element and the light emitting element, respectively, a spacing between the light emitting element and the second lens portion being greater than a spacing between the light receiving element and the first lens portion.

22. An optical communication module comprising:

a substrate formed with a recess which has an opening at an obverse surface of the substrate;

a bonding conductor layer covering at least a bottom surface of the recess;

a light emitting element mounted on the bonding conductor layer;

a light receiving element mounted on the obverse surface of the substrate for receiving light; and a resin package covering the light emitting element and the light receiving element, the resin package including a first lens carrying surface formed with a first dome-shaped lens portion facing one of the light emitting element and the light receiving element, the resin package also including a second lens carrying surface formed with a second lens portion facing the other of the light emitting element and the light receiving element, the first lens carrying surface being located lower than the second lens carrying surface and separated from the second lens carrying surface by an upright wall;

wherein the resin package is formed with an inclined portion connecting the first lens carrying surface of the resin package to a periphery of the first lens portion via a boundary and forming an obtuse angle with respect to the periphery of the first lens portion, an angle of inclination of the inclined portion with respect to the first lens carrying surface being smaller than an angle of inclination of the periphery of the first lens portion adjoining the boundary, a recessed space being defined by the inclined portion, the first lens carrying surface and the upright wall; and wherein the recessed space includes a bottom surface defined by the first lens carrying surface, the bottom surface of the recessed space being located above the light receiving element.

23. An optical communication module comprising:

a substrate formed with a recess which has an opening at an obverse surface of the substrate;

a bonding conductor layer covering at least a bottom surface of the recess;

a light emitting element mounted on the bonding conductor layer;

a light receiving element mounted on the obverse surface of the substrate for receiving light; and a resin package covering the light emitting element and the light receiving element, the resin package including an opposite pair of side surfaces, the resin package also including a first lens carrying surface and a second lens carrying surface between the opposite pair of side surfaces, the first lens carrying surface being formed with a first dome-shaped lens portion facing one of the light emitting element and the light receiving element, the second lens carrying surface being formed with a second lens portion facing the other of the light emitting element and the light receiving element, the first lens carrying surface being located lower than the second lens carrying surface and separated from the second lens carrying surface by an upright wall;

wherein the resin package is formed with an inclined portion connecting the first lens carrying surface of the resin package to a periphery of the first lens portion via a boundary and forming an obtuse angle with respect to the periphery of the first lens portion, an angle of inclination of the inclined portion with respect to the first lens carrying surface being smaller than an angle of inclination of the periphery of the first lens portion adjoining the boundary, a recessed space being defined by the inclined portion, the first lens carrying surface and the upright wall; and wherein the recessed space has varying width that progressively increases toward the opposite pair of side surfaces.

* * * * *